(12) United States Patent
Saito

(10) Patent No.: US 10,001,258 B2
(45) Date of Patent: Jun. 19, 2018

(54) LIGHT FLUX CONTROL MEMBER, LIGHT-EMITTING DEVICE, AND ILLUMINATION DEVICE

(71) Applicant: Enplas Corporation, Saitama (JP)

(72) Inventor: Tomohiro Saito, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 302 days.

(21) Appl. No.: 14/914,968

(22) PCT Filed: Aug. 29, 2014

(86) PCT No.: PCT/JP2014/072730
§ 371 (c)(1),
(2) Date: Feb. 26, 2016

(87) PCT Pub. No.: WO2015/030169
PCT Pub. Date: Mar. 5, 2015

(65) Prior Publication Data
US 2016/0223157 A1 Aug. 4, 2016

(30) Foreign Application Priority Data

Aug. 29, 2013 (JP) .................................. 2013-178013
Oct. 18, 2013 (JP) .................................. 2013-217232

(51) Int. Cl.
*F21V 5/00* (2018.01)
*F21V 5/04* (2006.01)
(Continued)

(52) U.S. Cl.
CPC ................ *F21V 5/045* (2013.01); *F21V 3/00* (2013.01); *F21V 7/00* (2013.01); *F21V 13/04* (2013.01);
(Continued)

(58) Field of Classification Search
CPC . F21V 5/002; F21V 5/005; F21V 5/04; F21V 5/045; F21V 5/046; F21V 5/048
See application file for complete search history.

(56) References Cited

U.S. PATENT DOCUMENTS

2009/0180286 A1* 7/2009 Bamba .................... F21V 5/045
362/297
2012/0075870 A1* 3/2012 Kayanuma ............... F21V 5/04
362/311.06
(Continued)

FOREIGN PATENT DOCUMENTS

JP       H11-065490 A    3/1999
WO       2013/065408 A1  5/2013
(Continued)

OTHER PUBLICATIONS

International Search Report from International Application No. PCT/JP2014/072730 dated Oct. 28, 2014.

*Primary Examiner* — Jong-Suk (James) Lee
*Assistant Examiner* — Zheng Song
(74) *Attorney, Agent, or Firm* — Brundidge & Stanger, P.C.

(57) ABSTRACT

The entrance region of this light flux control member has second protruding strips disposed at the edges of a virtual quadrangle, and angle parts disposed at the four corners of the virtual quadrangle. The angle parts having a third entrance face, and a third reflective face establishing a connection between two neighboring second reflective faces. The height of a third crest line at the boundary between the third entrance face and the third reflective face decreases gradually as a diagonal line of the virtual quadrangle is approached. The distance between the outermost edge of the third reflective face and the third crest line decreases gradually as the diagonal line of the virtual quadrangle is approached. The distance between the (Continued)

extremities of a second crest line of the second protruding strip is shorter than the distance between the extremities of a first crest line located most outward.

6 Claims, 27 Drawing Sheets

(51) Int. Cl.

| | | |
|---|---|---|
| *G02B 19/00* | (2006.01) | |
| *F21V 3/00* | (2015.01) | |
| *F21V 7/00* | (2006.01) | |
| *F21V 13/04* | (2006.01) | |
| *G03B 15/05* | (2006.01) | |
| *G02B 3/08* | (2006.01) | |
| *H01L 33/58* | (2010.01) | |
| *F21Y 115/10* | (2016.01) | |

(52) U.S. Cl.
CPC ..... *G02B 19/0028* (2013.01); *G02B 19/0061* (2013.01); *G03B 15/05* (2013.01); *F21V 5/002* (2013.01); *F21V 5/005* (2013.01); *F21V 5/04* (2013.01); *F21V 5/048* (2013.01); *F21Y 2115/10* (2016.08); *G02B 3/08* (2013.01); *G03B 2215/0567* (2013.01); *G03B 2215/0592* (2013.01); *H01L 33/58* (2013.01)

(56) References Cited

U.S. PATENT DOCUMENTS

| | | | |
|---|---|---|---|
| 2013/0058085 A1* | 3/2013 | Lee | F21V 5/04 362/245 |
| 2013/0314925 A1* | 11/2013 | Jiang | F21V 5/04 362/311.02 |
| 2014/0168972 A1* | 6/2014 | Ebner | F21V 5/007 362/235 |
| 2014/0355273 A1 | 12/2014 | Saito | |

FOREIGN PATENT DOCUMENTS

| | | |
|---|---|---|
| WO | 2013/111534 A1 | 8/2013 |
| WO | 2014/073158 A1 | 5/2014 |

\* cited by examiner

LIGHT FLUX CONTROL MEMBER, LIGHT-EMITTING DEVICE, AND ILLUMINATION DEVICE

TECHNICAL FIELD

The present invention relates to a light flux controlling member that controls the distribution of light emitted from a light emitting element. The present invention also relates to a light-emitting device and an illumination apparatus having the light flux controlling member.

BACKGROUND ART

In recent years, for the purpose of energy saving and downsizing, light-emitting devices (LED flash) using a light-emitting diode (hereinafter referred to as "LED") as the light source have been increasingly used as a light-emitting device for an image pickup camera. A well-known example of such light emitting devices is a light emitting device using a combination of an LED and a fresnel lens.

In general, the imaging region of an imaging camera is square. Therefore, a light-emitting device preferably illuminates the illumination region in a square shape to obtain clear captured image. In view of this, desirably, a fresnel lens used in a light-emitting device for an imaging camera uniformly and efficiently illuminates a square illumination region with light emitted from a light emitting element. Conventionally, various fresnel lenses for illuminating a square illumination region have been proposed (see, for example, PTL 1).

FIG. 1A is a perspective view of fresnel lens 10 disclosed in PTL 1. Fresnel lens 10 illustrated in FIG. 1A can provide a function same as that of cylindrical lens 20 illustrated in FIG. 1B. As illustrated in FIG. 1A, in fresnel lens 10 disclosed in PTL 1, a plurality of rectangular grooves 12 are concentrically disposed with a space therebetween in plan view.

CITATION LIST

Patent Literature

PTL 1
Japanese Patent Application Laid-Open No. 11-065490

SUMMARY OF INVENTION

Technical Problem

However, when a square illumination region is illuminated with light with use of the fresnel lens disclosed in PTL 1, the square illumination region cannot be sufficiently or uniformly illuminated with the light emitted from the light emitting element in an efficient manner, and for this reason the fresnel lens disclosed in PTL 1 has a room for improvement.

An object of the present invention is to provide a light flux controlling member which can uniformly and efficiently illuminate a square illumination region with light emitted from a light emitting element. In addition, an object of the present invention is to provide a light-emitting device and an illumination apparatus including the light flux controlling member.

Solution to Problem

A light flux controlling member of the present invention is configured to control distribution of light emitted from a light emitting element, the light flux controlling member including: an incidence region on which the light emitted from the light emitting element is incident; and an emission region formed on a side opposite to the incidence region, and configured to emit light incident on the incidence region, in which the incidence region includes: a fresnel lens section including a plurality of first projected lines, each first projected line including a first incidence surface on which a part of the light emitted from the light emitting element is incident, a first reflecting surface paired with the first incidence surface and configured to reflect incident light toward the emission region, and a first ridgeline configured to join adjacent two diagonals of a first virtual square, and an outermost lens section including four second projected lines and corner portions, each second projected line including a second incidence surface on which another part of the light emitted from the light emitting element is incident, and a second reflecting surface paired with the second incidence surface and configured to reflect incident light toward the emission region, each second projected line being disposed on a side of a second virtual square disposed outside the first virtual square, each corner portion being disposed at one of four corners of the second virtual square and configured to connect adjacent two second projected lines of the four second projected lines to join the second projected lines; the first virtual square and the second virtual square are similar to each other, and are concentrically disposed such that sides thereof are parallel to each other; the incidence region is two-fold rotational symmetry or four-fold rotational symmetry around a center of the first virtual square and a center of the second virtual square as a rotational axis; the corner portion is a part of a substantially conical member whose vertex is located on a center side of the second virtual square, the corner portion including a third reflecting surface and a third incidence surface which correspond to side surfaces of the substantially conical member, the third reflecting surface being configured to connect the two adjacent second reflecting surfaces to join the second reflecting surfaces, the third incidence surface being paired with the third reflecting surface and being a surface on which still another part of the light emitted from the light emitting element section is incident; a third ridgeline formed at a connecting part between the third incidence surface and the third reflecting surface has a height which gradually decreases toward a diagonal of the second virtual square; an interval between an outermost edge of the third reflecting surface and the third ridgeline gradually decreases toward the diagonal of the second virtual square in plan view of the incidence region; and an end-to-end distance of a second ridgeline of the second projected line is smaller than an end-to-end distance of the first ridgeline of the first projected line located at an outermost position.

A light-emitting device of the embodiments of the present invention comprising: a light emitting element; and the light flux controlling member, in which the light flux controlling member is disposed such that an optical axis of the light emitting element passes through a center of the second virtual square, and the second ridgeline has a length greater than a maximum size of the light emitting element in an extending direction of the second projected line.

An illumination apparatus of the embodiments of the present invention includes: the light-emitting device; and a cover configured to allow the light emitted from the light-emitting device to pass therethrough while diffusing the light.

Advantageous Effects of Invention

In comparison with a light-emitting device having a conventional light flux controlling member, the light-emitting device having the light flux controlling member of the embodiments of the present invention can uniformly and efficiently illuminate a square illumination region. Therefore, the illumination apparatus of the embodiments of the present invention causes less luminance unevenness in comparison with the conventional illumination apparatus.

DESCRIPTION OF EMBODIMENTS

In the following, embodiments of the present invention will be described in detail with reference to the accompanying drawings.

Embodiment 1

Configurations of Light Flux Controlling Member and Light-Emitting Device

Figure 1A:
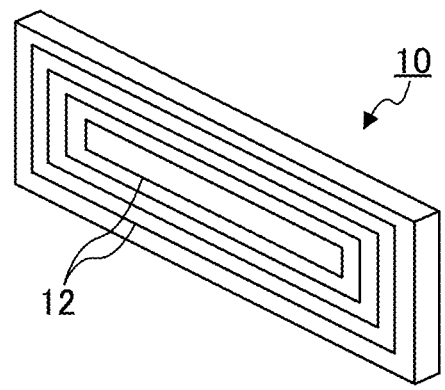
FIGS. 1A and 1B illustrate a configuration of a fresnel lens disclosed in PTL 1.
Figure 1B:
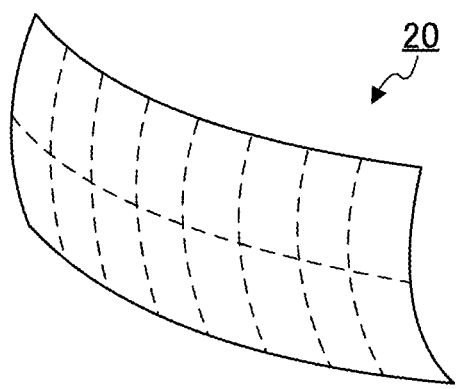
Figure 2:
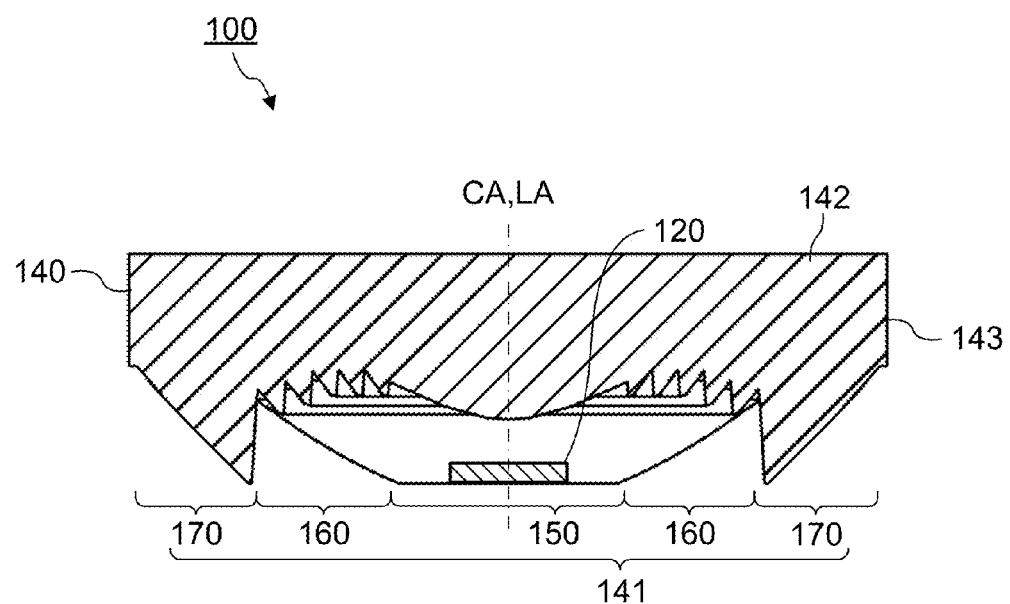
FIG. 2 is a sectional view of a light-emitting device according to Embodiment 1.

FIG. 2 is a sectional view of light-emitting device 100 according to Embodiment 1 of the present invention. As illustrated in FIG. 2, light-emitting device 100 includes light emitting element 120 and light flux controlling member 140. Light emitting element 120 is a light-emitting diode (LED) such as a white light-emitting diode, for example. Light flux controlling member 140 controls the distribution of the light emitted from light emitting element 120. Light flux controlling member 140 is disposed in such a manner that its central axis CA coincides with optical axis LA of light emitting element 120.

The material of light flux controlling member 140 is not specifically limited as long as the light having desired wavelengths can pass through light flux controlling member 140. Examples of the material of light flux controlling member 140 include: light transmissive resins such as polymethylmethacrylate (PMMA), polycarbonate (PC), and epoxy resin (EP); and glass. Light flux controlling member 140 can be manufactured by injection molding, for example.

Figure 3:
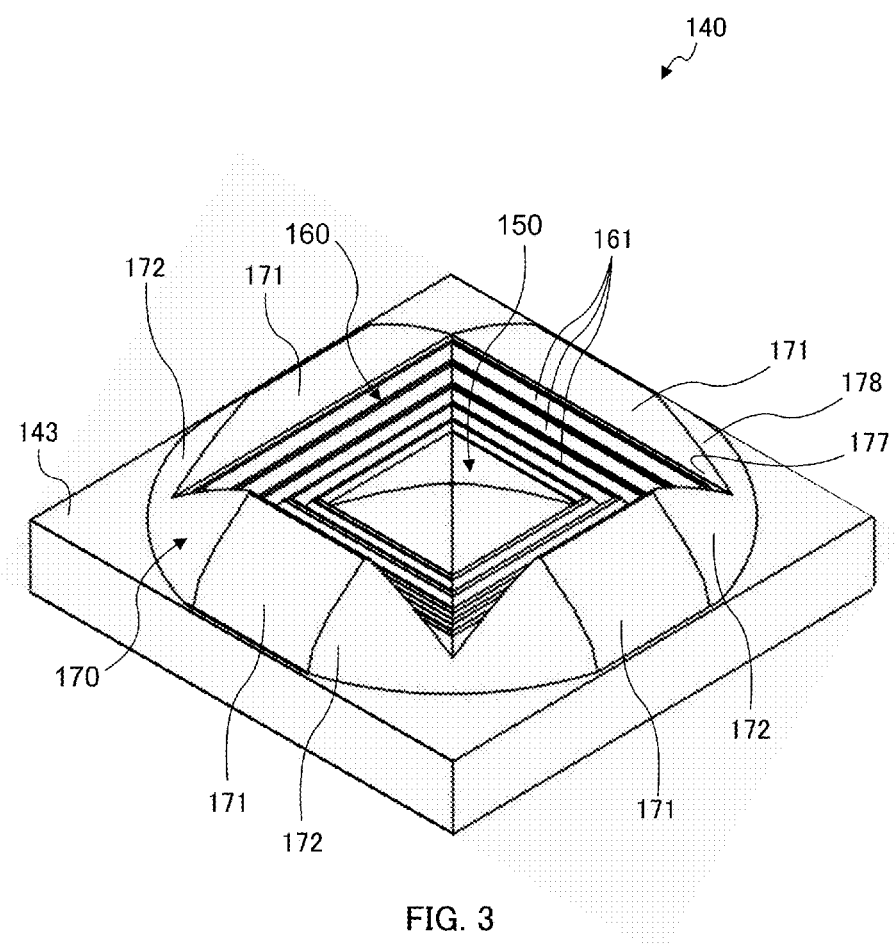
FIG. 3 is a perspective view of a light flux controlling member according to Embodiment 1.
Figure 7:
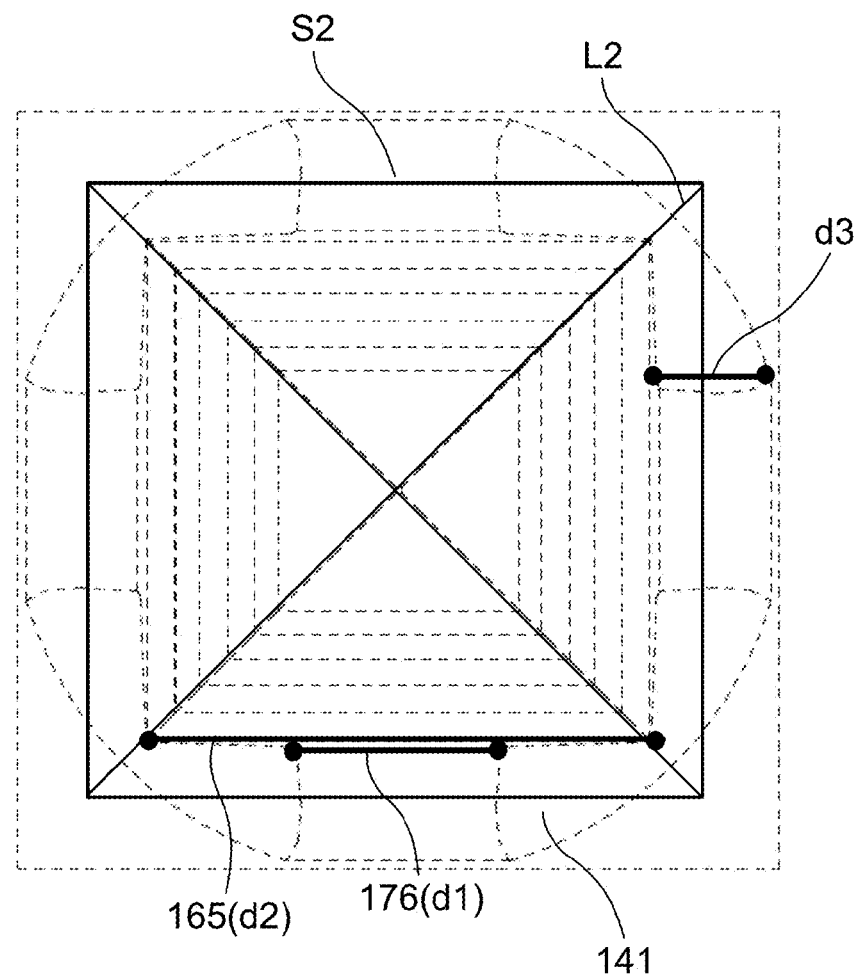
FIG. 7 is a drawing for describing installation positions of a second projected line and a corner portion.

FIG. 3 to FIG. 7 illustrate a configuration of light flux controlling member 140 according to Embodiment 1. FIG. 3 is a perspective view of light flux controlling member 140 according to Embodiment 1. FIGS. 4A to 4C are a plan view, a bottom view, and a side view of light flux controlling member 140, respectively. FIG. 5A is a bottom view of light flux controlling member 140 illustrating only first virtual square S1, and FIG. 5B is a bottom view of light flux controlling member 140 illustrating only first virtual square S1 and second virtual square S2. FIG. 6A is a sectional view taken along line A-A of FIG. 4B, and FIG. 6B is a partially enlarged sectional view of a region denoted with the broken line in FIG. 6A. FIG. 7 is a drawing for describing installation positions of second projected line 171 and corner portion 172.

As illustrated in FIG. 3 to FIG. 7, light flux controlling member 140 includes incidence region 141 on which light emitted from light emitting element 120 is incident, and emission region 142 provided on the side opposite to incidence region 141 and configured to output the light incident on incidence region 141. Flange 143 may be provided between incidence region 141 and emission region 142.

Figure 4A:
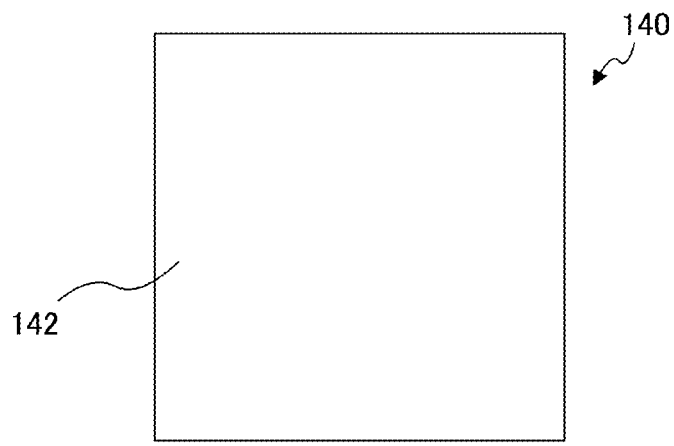
FIGS. 4A to 4C illustrate a configuration of the light flux controlling member according to Embodiment 1.
Figure 4B:
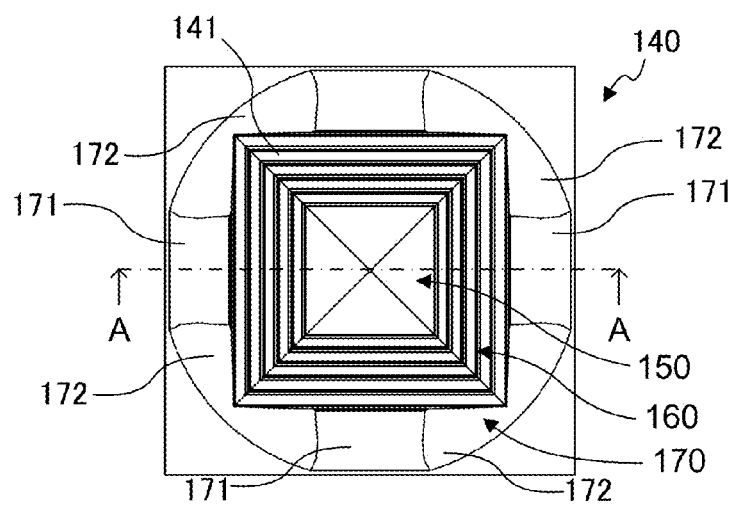
Figure 4C:
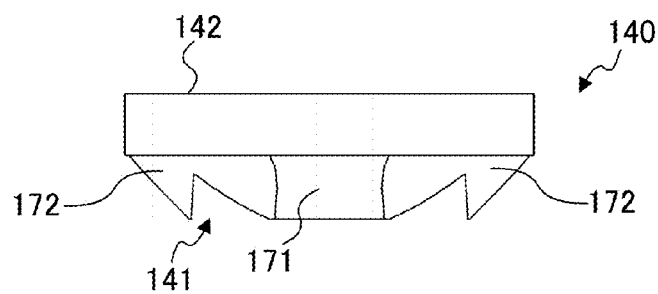

The shape of light flux controlling member 140 in plan view is not limited. As illustrated in FIG. 4A, light flux controlling member 140 according to the present embodiment has a square shape in plan view. In addition, the length of one side of light flux controlling member 140 of the present embodiment is about 4.7 mm, for example.

Light emitted from light-emitting elements 120 is incident on incidence region 141. Incidence region 141 includes refraction section 150 provided at a center portion of incidence region 141, fresnel lens section 160 provided outside refraction section 150, and outermost lens section 170 provided outside fresnel lens section 160. Incidence region 141 is two-fold rotational symmetry or four-fold rotational symmetry around the center of first virtual square S1 and the center of second virtual square S2 described later as a rotational axis. The rotational axis coincides with central axis CA of light flux controlling member 140 and optical axis LA of light emitting element 120. Accordingly, incidence region 141 is two-fold rotational symmetry or four-fold rotational symmetry around central axis CA of light flux controlling member 140 and optical axis LA of light emitting element 120. The external shape of incidence region 141 is rectangular or square, for example.

Refraction section 150 allows part of light emitted from light emitting element 120 (light emitted at a small angle with respect to optical axis LA) to enter light flux controlling member 140, and refracts the incident light toward emission region 142. Refraction section 150 is disposed at a position facing light emitting element 120 in such a manner as to intersect with central axis CA of light flux controlling member 140 (optical axis LA of light emitting element 120) (see FIG. 2). As long as refraction part 150 can have the above-mentioned function, the shape of refraction part 150 is not limited. For example, refraction section 150 may have a shape of a refractive fresnel lens. In addition, the surface of refraction section 150 may be a spherical surface or an aspherical surface. In the present embodiment, the surface of refraction section 150 is an aspherical surface, and the shape of refraction section 150 is a substantially square pyramid shape (see FIGS. 2 and 3).

Fresnel lens section 160 allows part of light emitted from light emitting element 120 (light emitted at a relatively large angle with respect to optical axis LA) to enter light flux controlling member 140, and reflects the incident light toward emission region 142. Fresnel lens section 160 includes a plurality of first projected lines 161 configured to control the travelling direction of light emitted from light emitting element 120.

Figure 5A:
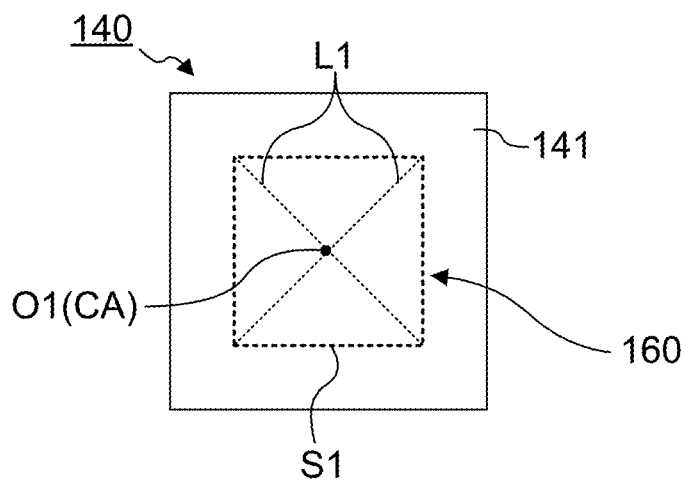
FIGS. 5A and 5B are bottom views of the light flux controlling member according to Embodiment 1 in which a refraction section, a fresnel lens section and a reflection section are omitted.

As illustrated in FIG. 5A, it is assumed that first virtual square S1 is disposed in fresnel lens section 160. Center O1 (the intersection of diagonals L1) of first virtual square S1 coincides with central axis CA of light flux controlling member 140. First virtual square S1 and four diagonals L1 serve as references for disposing first projected lines 161. First projected lines 161 are disposed to join adjacent two diagonals L1. First projected lines 161 may have a straight shape or a curved shape. In addition, first projected lines 161 are disposed to form a valley part between adjacent two first projected lines 161 in a region between adjacent two diagonals L1 (see FIG. 6B).

The shape and the size of first projected line 161 are not limited, and may be identical to one another, or different from one another. In the present embodiment, the sizes of first projected lines 161 are different from one another (see FIG. 6B). In addition, in the optical axis LA direction, distance d (distance d from the reference surface to first ridgeline 165) between the lower end of light flux controlling member 140 and first ridgeline 165 of each first projected line 161 gradually decreases toward the outer side from the inner side (see FIG. 6B). Here, the "lower end of light flux controlling member 140" means the apex of second projected line 171 (second ridgeline 176) described later, and the "reference surface" means a plane including the apex of second projected line 171 (second ridgeline 176).

First projected line 161 includes first incidence surface 162, first reflecting surface 163, first connection surface 164 and first ridgeline 165. In first projected line 161, first incidence surface 162 is disposed on the inner side (central axis CA side), and first reflecting surface 163 is disposed on the outer side (see FIG. 6B).

Part of light emitted from light emitting element 120 is incident on first incidence surface 162, and first incidence surface 162 refracts the light to first reflecting surface 163 side. First incidence surface 162 may be a planar surface or a curved surface. In the present embodiment, first incidence surface 162 is a planar surface. In addition, first incidence surface 162 may be parallel to central axis CA (optical axis LA of light emitting element 120), or may be tilted with respect to central axis CA. In the present embodiment, for the purpose of facilitating the releasing, first incidence surface 162 is tilted such that the distance from central axis CA increases toward the lower end (reference surface) of light flux controlling member 140. Preferably, the inclination angle of first incidence surface 162 is greater than 0 degree, and equal to or smaller than 10 degrees with respect to central axis CA in any cross-section including central axis CA. The inclination angle of first incidence surface 162 is preferably 5 degrees or smaller, more preferably 3 degrees or smaller.

First reflecting surface 163 is paired with first incidence surface 162, and configured to reflect the light incident on first incidence surface 162 toward emission region 142. First reflecting surface 163 may be a planar surface or a curved surface. In the present embodiment, first reflecting surface 163 is a planar surface. In addition, for the purpose of totally reflecting the light that has reached first reflecting surface 163, first reflecting surface 163 is tilted with respect to central axis CA. First reflecting surface 163 is tilted such that the distance to central axis CA decreases toward the lower end (reference surface) of light flux controlling member 140.

First connection surface 164 joins first incidence surface 162 and first reflecting surface 163. First connection surface 164 may be a planar surface, or a curved surface. In the present embodiment, first connection surface 164 is a planar surface. In addition, it is also possible to directly join first incidence surface 162 and first reflecting surface 163 without forming first connection surface 164.

First ridgeline 165 is a boundary line between first incidence surface 162 and first connection surface 164. First ridgeline 165 is disposed to join adjacent two diagonals L1 of first virtual square S1. It is to be noted that, when first connection surface 164 not formed, first ridgeline 165 is a boundary line between first incidence surface 162 and first reflecting surface 163. When first connection surface 164 is provided between first incidence surface 162 and first reflecting surface 163, the manufacturing performance can be enhanced by eliminating an acute angle portion. In plan view of incidence region 141, first ridgeline 165 may be a straight line, or a curved line. In the present embodiment, in plan view of incidence region 141, first ridgeline 165 is a straight line.

Outermost lens section 170 allows part of light emitted from light emitting element 120 (light emitted at a large angle with respect to optical axis LA) to enter light flux controlling member 140, and reflects the incident light toward emission region 142. Outermost lens section 170 includes four second projected lines 171, and four corner portions 172.

Figure 5B:
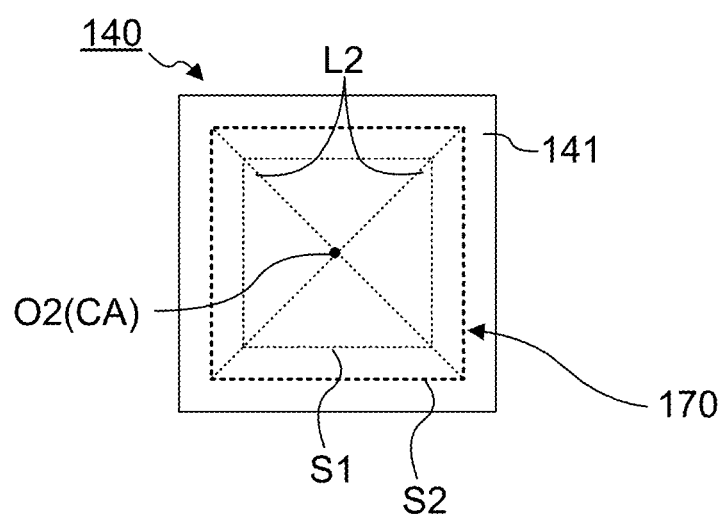
Figure 6A:
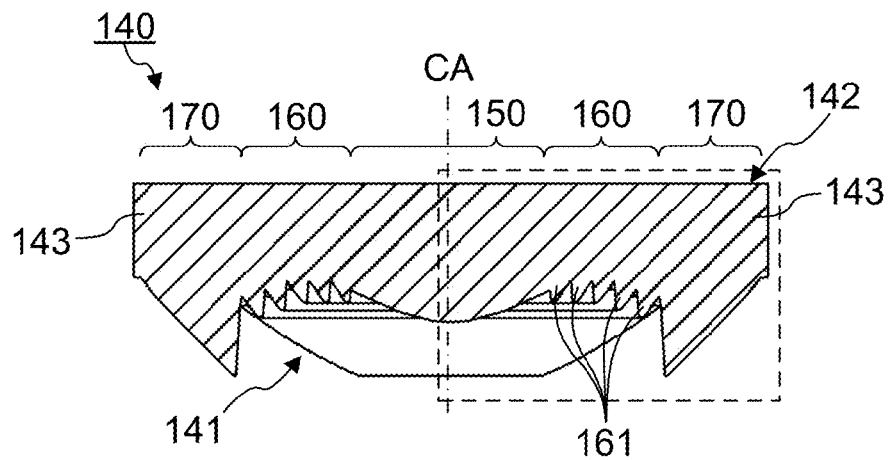
FIGS. 6A and 6B are sectional views of the light flux controlling member according to Embodiment 1.
Figure 6B:
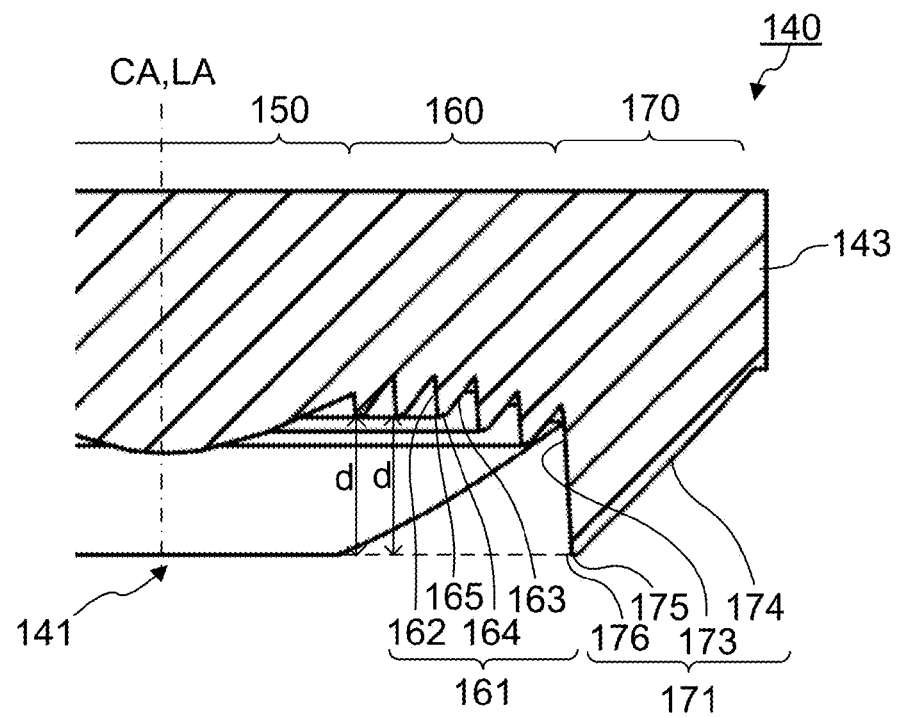

As illustrated in FIG. 5B, it is assumed that second virtual square S2 is disposed in outermost lens section 170. Center O2 (the intersection of second diagonals L2) of second virtual square S2 coincides with central axis CA of light flux controlling member 140. Second virtual square S2 serves as a reference for disposing four second projected lines 171 and four corner portions 172. Second virtual square S2 is disposed outside first virtual square S1. Second virtual square S2 and first virtual square S1 are similar to each other, and are concentrically disposed such that each side of second virtual square S2 and first virtual square S1 are parallel to each other. It is only necessary that first ridgeline 165 is disposed to join adjacent two diagonals L1 of first virtual square S1 as described above. Accordingly, first ridgeline 165 and second ridgeline 176 described later may be formed in curved lines, and therefore may not be parallel to each other.

Four second projected lines 171 are disposed on respective sides of second virtual square S2. In the plane orthogonal to the side on which second projected line 171 is disposed, the cross-sectional area of second projected line 171 is greater than that of first projected line 161. Both ends of second projected line 171 are connected with respective corner portions 172. In the direction parallel to the side of second virtual square S2, the length of second projected line 171 is smaller than that of outermost first projected line 161. When light flux controlling member 140 is used in the above-mentioned light-emitting device 100, it is preferable that the length of second projected line 171 be greater than the width of light emitting element 120 used for light-emitting device 100 in the direction parallel to the side of second virtual square S2.

Second projected line 171 is formed in a substantially triangular prism shape. In the plane orthogonal to the side on which second projected line 171 is disposed, the cross-sectional shape of second projected line 171 is a substantially triangular shape. Each second projected line 171 includes second incidence surface 173, second reflecting surface 174, second connection surface 175 and second ridgeline 176. In second projected line 171, second incidence surface 173 is disposed on the inner side (central axis CA side), and second reflecting surface 174 is disposed on the outer side (see FIG. 6B).

Light emitted from light emitting element 120 is incident on second incidence surface 173, and second incidence surface 173 refracts the incident light to second reflecting surface 174 side. Second incidence surface 173 may be a planar surface, or a curved surface. In the present embodiment, second incidence surface 173 is a planar surface. In addition, second incidence surface 173 may be parallel to central axis CA, or may be tilted with respect to central axis CA. In the present embodiment, for the purpose of facilitating the releasing, second incidence surface 173 is tilted such that the distance from central axis CA increases toward the lower end (reference surface) of light flux controlling member 140.

Second reflecting surface 174 is paired with second incidence surface 173, and is configured to reflect the light incident on second incidence surface 173 toward emission region 142. Second reflecting surface 174 may be a planar surface or a curved surface. In the present embodiment, second reflecting surface 174 is a curved surface. Second reflecting surface 174 is a straight line in cross-section (horizontal cross-section) orthogonal to central axis CA. In addition, second reflecting surface 174 is a curved line protruding outward in a cross-section (perpendicular cross-section) including central axis CA.

Second connection surface 175 joins second incidence surface 173 and second reflecting surface 174. Second connection surface 175 may be a planar surface or a curved surface. In the present embodiment, second connection surface 175 is a planar surface. In addition, it is also possible to directly join second incidence surface 173 and second reflecting surface 174 without forming second connection surface 175.

Second ridgeline 176 is a boundary line between second incidence surface 173 and second connection surface 175. It is to be noted that, when second connection surface 175 is not formed, second ridgeline 176 is a boundary line between second incidence surface 173 and second reflecting surface 174. When second connection surface 175 is provided between second incidence surface 173 and second reflecting surface 174, manufacturing performance can be enhanced by eliminating an acute angle portion. In addition, as illustrated in FIG. 7, end-to-end distance d1 of second ridgeline 176 is smaller than end-to-end distance d2 of first ridgeline 165 of outermost first projected line 161. In addition, when light flux controlling member 140 is used in the above-mentioned light-emitting device 100, end-to-end distance d1 of second ridgeline 176 is preferably greater than the width of light emitting element 120 used in light-emitting device 100.

Four corner portions 172 are respectively disposed at the four corners of second virtual square S2. Corner portion 172 is a part of a substantially conical member whose vertex is located on center O2 side of second virtual square S2. Corner portion 172 includes third incidence surface 177, third reflecting surface 178 and third ridgeline 179. Here, the "substantially conical member (cone)" is a stereoscopic shape which is obtained by connecting the vertex and the outer peripheral edges of the bottom surface with a straight line or curved line. Examples of the substantially conical member (cone) include a pyramidal member, a substantially pyramidal member whose lines connecting the vertex and circumferential points of the bottom surface protrude outward, a substantially pyramidal member whose lines connecting the vertex and circumferential points of the bottom surface protrude inward, a conical member, a substantially conical member whose generatrix protrudes outward, and a substantially conical member whose generatrix protrudes inward. In the present embodiment, the substantially conical member (cone) is a substantially conical member whose generatrix protrudes outward.

Still another part of the light emitted from light emitting element 120 is incident on third incidence surface 177, and third incidence surface 177 refracts the light to third reflecting surface 178 side. Third incidence surface 177 may be a planar surface or a curved surface. In the present embodiment, third incidence surface 177 is composed of two planar surfaces. In addition, third incidence surface 177 may be parallel to central axis CA, or may be tilted with respect to central axis CA. In the present embodiment, for the purpose of facilitating the releasing, the two planar surfaces are tilted with respect to central axis CA. The two planar surfaces are tilted such that the distance from central axis CA increases toward the lower end (reference surface) of light flux controlling member 140. The two planar surfaces of third incidence surface 177 may be flush with adjacent second incidence surface 173.

Third reflecting surface 178 is paired with third incidence surface 177, and is configured to reflect the light incident on third incidence surface 177 toward emission region 142. In the present embodiment, third reflecting surface 178 is a curved surface. In a cross-section (horizontal cross-section) orthogonal to central axis CA, the outer edge of third reflecting surface 178 is a curved line protruding outward. In addition, in a cross-section (perpendicular cross-section) including central axis CA, the outer edge of third reflecting surface 178 is a curved line protruding outward. Third reflecting surface 178 corresponds to a part of a side surface of a substantially conical member, and connects adjacent two second reflecting surfaces 174 to join two second reflecting surfaces 174.

Third ridgeline 179 is a boundary line between third incidence surface 177 and third reflecting surface 178. As described later, third ridgeline 179 is a curved line which is formed such that the distance to emission region 142 gradually decreases toward second diagonal L2 of second virtual square S2 from second projected line 171 side. In addition, as illustrated in FIG. 7, distance d3 between the outermost edge of third reflecting surface 178 and third ridgeline 179 gradually decreases toward diagonal L2 of second virtual square S2 in plan view of incidence region 141. With this configuration, at a position where corner portion 172 and second diagonal L2 of second virtual square S2 intersect with each other, a recessed portion is formed. It is to be noted that the boundary between third incidence surface 177 and third reflecting surface 178 may be chamfered to form a connection surface (third connection surface). In this case, third ridgeline 179 is a boundary line between third incidence surface 177 and the third connection surface.

Figure 8A:
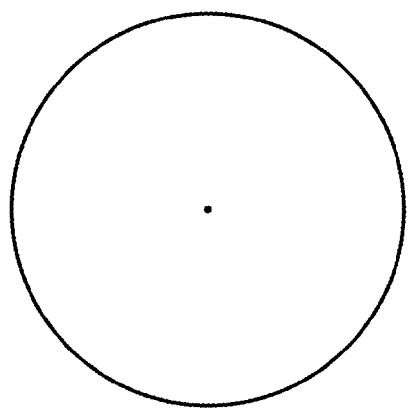
FIGS. 8A to 8C are drawings for describing the stereoscopic shape of the corner portion.
Figure 8B:
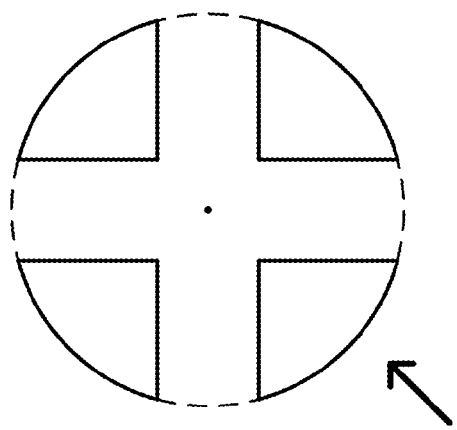
Figure 8C:
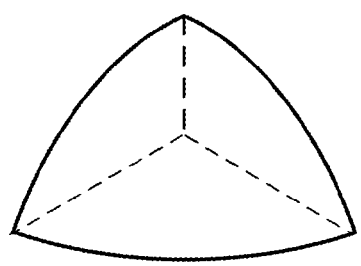
Figure 9A:
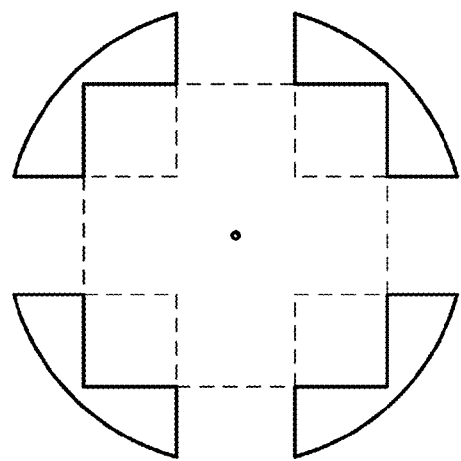
FIGS. 9A and 9B are drawings for describing the stereoscopic shape of the corner portion.
Figure 9B:
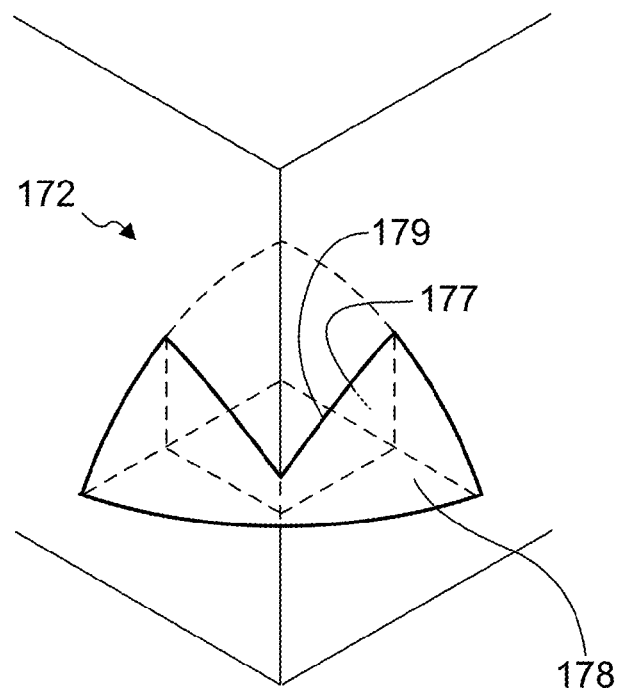

FIGS. 8 and 9 are drawings for describing the stereoscopic shape of corner portion 172. It is to be noted that FIG. 8C is a perspective view in the arrow direction of FIG. 8B. As described above, corner portion 172 is a part of a substantially conical member (cone). Here, a substantially conical member having a circular bottom surface is assumed (see FIG. 8A). The substantially conical member is vertically cut by a cross having a predetermined width (see FIGS. 8B and 8C). At this time, the width of the cross is equal to the length of second projected line 171 in the direction of the side of second virtual square S2. Next, a center part of the substantially conical member is removed such that third incidence surface 177 is tilted in the above-mentioned fashion (see FIGS. 9A and 9B). At this time, the side surface of the substantially conical member is a curved surface, and therefore third ridgeline 179 is formed such that the distance to emission region 142 gradually decreases toward second diagonal L2 of second virtual square S2 from second projected line 171 side. It is to be noted that, in the present embodiment, each of third reflecting surfaces 178 of four corner portions 172 is a part of the side surface of one substantially conical member whose vertex is located on central axis CA of light flux controlling member 140 (central axis CA of light flux controlling member 140 and the central axis of the substantially conical member coincide with each other). However, four third reflecting surfaces 178 may be parts of side surfaces of substantially conical members having different central axes.

Emission region 142 is a planar surface or a curved surface formed on a side nearer to the region to be illuminated, which is opposite to light emitting element 120 side. In the present embodiment, emission region 142 is a planar surface. Emission region 142 is formed to intersect with central axis CA of light flux controlling member 140 (see FIG. 2). The light which is incident on refraction section 150, the light which is incident on first incidence surface 162 and reflected at first reflecting surface 163, the light which is incident on second incidence surface 173 and reflected at second reflecting surface 174, and the light which is incident on third incidence surface 177 and reflected at third reflecting surface 178 are emitted toward a region to be illuminated from emission region 142.

(Simulation)

Figure 10:
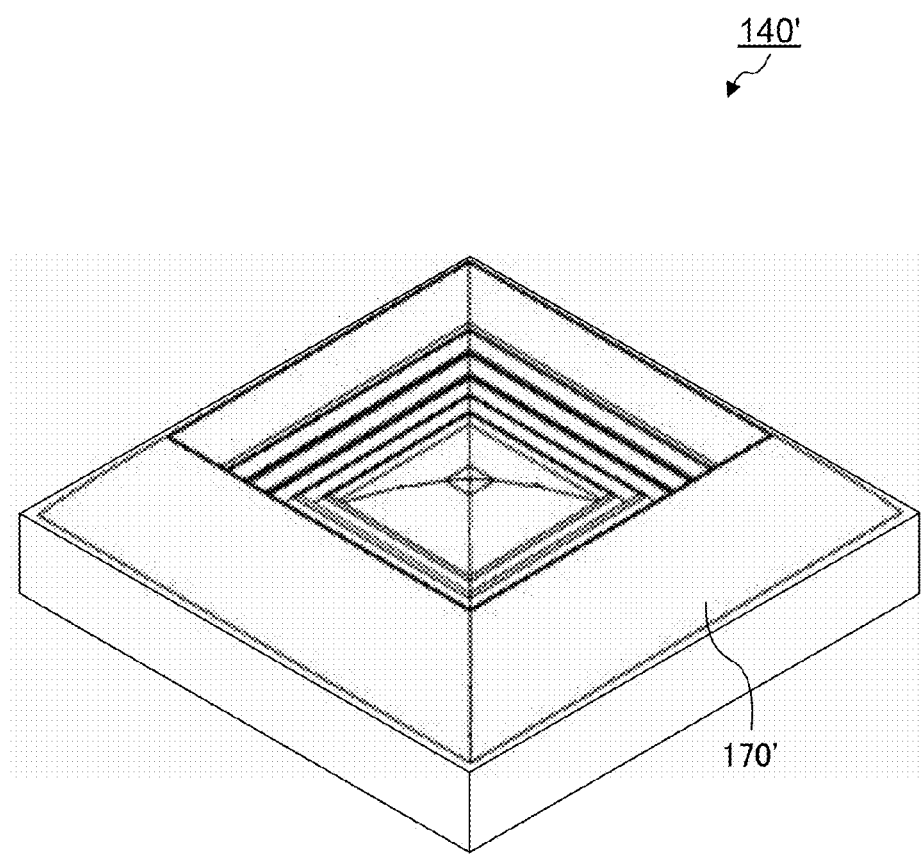
FIG. 10 is a perspective view of a light flux controlling member for comparison.

Simulation of the illuminance distribution was carried out in light-emitting device 100 having light flux controlling member 140 according to Embodiment 1. In addition, the illuminance distribution of a light-emitting device including light flux controlling member 140' having no corner portion 172 illustrated in FIG. 10 was also simulated for comparison.

Figure 11A:
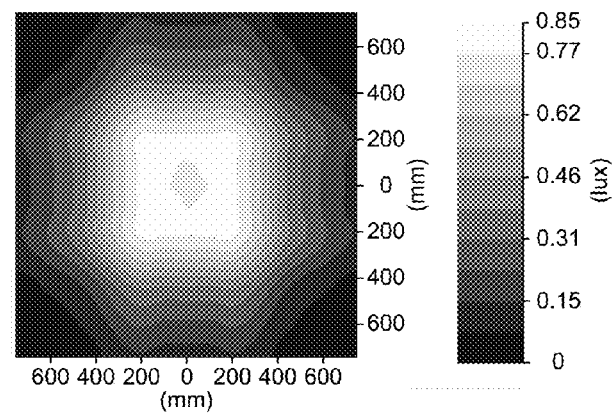
FIGS. 11A to 11C show simulation of the illuminance distribution using a light-emitting device having the light flux controlling member for comparison.
Figure 11B:
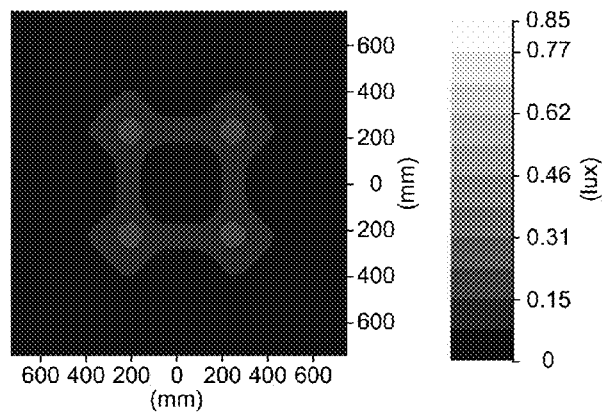
Figure 11C:
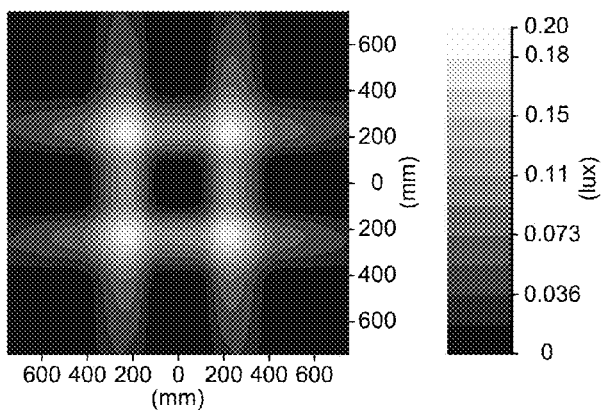

FIGS. 11A to 11C show simulation of the illuminance distribution of the light-emitting device having light flux controlling member 140' for comparison. FIG. 11A shows simulation of the illuminance distribution of light emitted via the entire light flux controlling member 140' for comparison, and FIGS. 11B and 11C show simulation of the illuminance distribution of light emitted via only outermost lens section 170'. In FIG. 11C, the sensitivity is increased in comparison with FIG. 11B. FIGS. 11A to 11C show simulation of the illuminance distribution in an exemplary case where a region to be illuminated is separated from the light emitting surface of light emitting element 120 by 1000 mm (the same applies to FIGS. 12A to 12C). In FIGS. 11A to 11C, the ordinate and the abscissa of the left diagrams indicate the distance (mm) from optical axis LA of light emitting element 120 (central axis CA of light flux controlling member 140'). In addition, the ordinate in the right diagrams indicates illuminance (lux).

As illustrated in FIG. 11A, it is recognized that light flux controlling member 140' for comparison having no corner portion 172 also can illuminate the illumination region with light in a square to a certain degree. In addition, as illustrated in FIG. 11B, it is recognized that the light via only outermost lens section 170' reaches peripheral portions of the illumination region. However, when the light via only outermost lens section 170' is analyzed in detail, it is recognized that light outward of the illumination region is generated at the four corners of light flux controlling member 140' as illustrated in FIG. 11C.

Figure 12A:
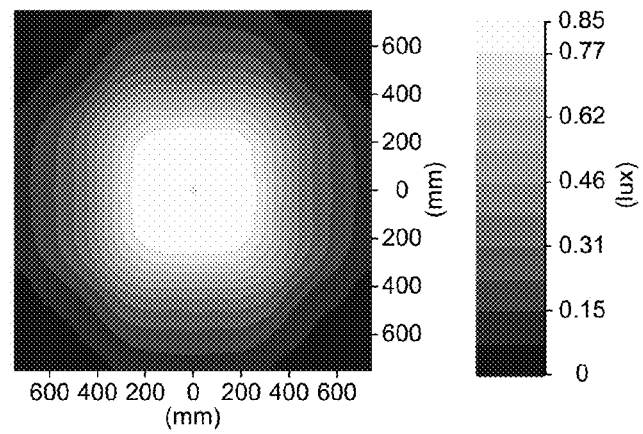
FIGS. 12A to 12C show simulation of the illuminance distribution using a light-emitting device having the light flux controlling member according to Embodiment 1.
Figure 12B:
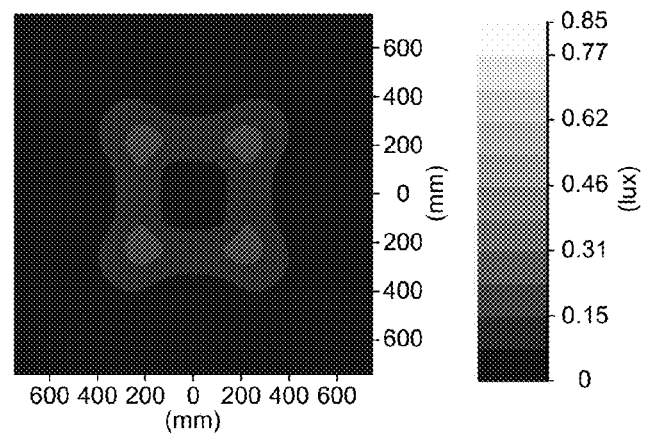
Figure 12C:
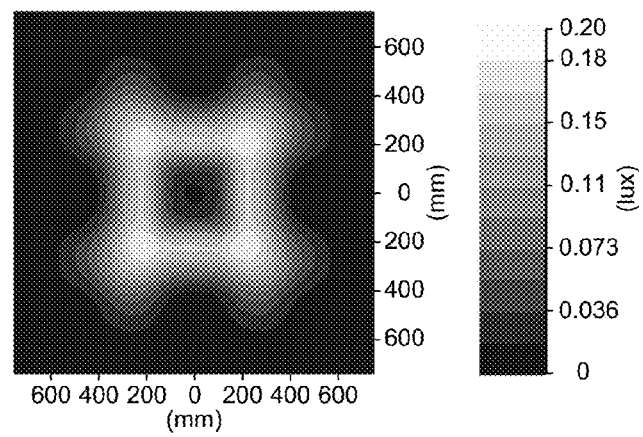

FIGS. 12A to 12C show simulation of the illuminance distribution in the case where light-emitting device 100 having light flux controlling member 140 according to Embodiment 1 is used. FIG. 12A shows simulation of the illuminance distribution of light emitted via the entire light flux controlling member 140 according to Embodiment 1, and FIGS. 12B and 12C show simulation of the illuminance distribution of light emitted via only outermost lens section 170. In FIG. 12C, the sensitivity is increased in comparison with FIG. 12B.

As illustrated in FIG. 12A, it is recognized that light flux controlling member 140 according to the present embodiment having corner portions 172 can illuminate the illumination region in a square form. In addition, as illustrated in FIG. 12B, it is recognized that the light via only outermost lens section 170 can illuminate the outline of the illumination region. Further, as illustrated in FIG. 12C, the light outward of the illumination region is not generated at the four corners of light flux controlling member 140. In view of the above, it can be said that light-emitting device 100 according to the present embodiment can uniformly illuminate the illumination region in comparison with the light-emitting device for comparison. Of the light emitted from light emitting element 120 toward corner portion 172, the light that passes through the recessed portion of corner portion 172 is not influenced by the control of corner portion 172, and travels to the illumination region without change. The amount of such uncontrolled light is small, and therefore a desired square-shaped illuminance distribution illustrated in FIG. 12 can be obtained without forming bright spots or dark points on the illuminated surface. Consequently, even when a burr-like wall part which is parallel to central axis CA (optical axis LA of light emitting element 120) is formed from third ridgeline 179 at the recessed portion, an effect similar to that of light flux controlling member 140 of Embodiment 1 is obtained when the burr-like wall part has no light flux controlling function (a second modification of Embodiment 3, see FIGS. 22 to 24).

(Configuration of Illumination Apparatus)

Next, illumination apparatus 400 having light-emitting device 100 according to the present embodiment will be described.

Figure 13:
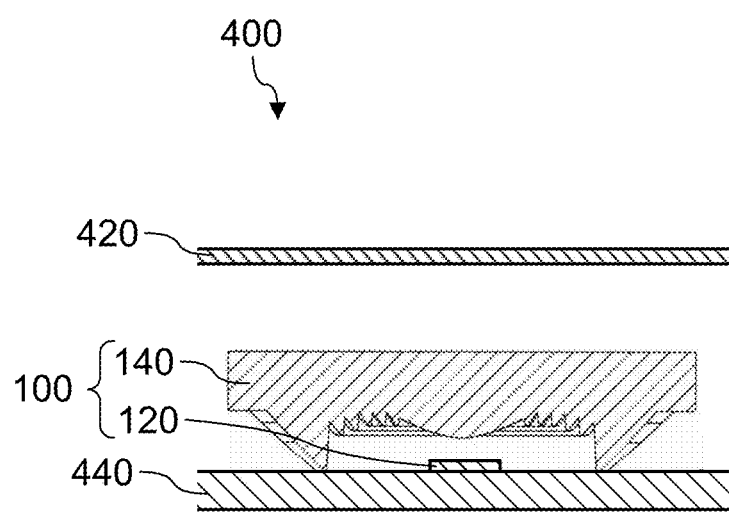
FIG. 13 illustrates a configuration of an illumination apparatus according to Embodiment 1.

FIG. 13 illustrates a configuration of illumination apparatus 400 according to the present embodiment. As illustrated in FIG. 13, illumination apparatus 400 includes light-emitting device 100 and cover 420. As described above, light-emitting device 100 includes light flux controlling member 140 and light emitting element 120. Light emitting element 120 is fixed to substrate 440.

Cover 420 allows the light emitted from light-emitting device 100 to pass therethrough while diffusing the light, and protects light-emitting device 100. Cover 420 is disposed on the light path of the light emitted from light-emitting device 100. As long as cover 420 can have the above-mentioned function, the material of cover 420 is not limited. Examples of the material of cover 420 include light transmissive resins such as polymethylmethacrylate (PMMA), polycarbonate (PC), and epoxy resin (EP); and glass.

(Modification)

A light-emitting device and an illumination apparatus according to a modification of Embodiment 1 are respectively different from light-emitting device 100 and illumination apparatus 400 according to Embodiment 1 in the shape of light flux controlling member 140. Therefore, the same components as those of light-emitting device 100 and illumination apparatus 400 according to Embodiment 1 are denoted with the same reference numerals and the description thereof are omitted, and, the components different from light flux controlling member 140 will be mainly described. Light flux controlling member 540 according to the modification of Embodiment 1 is different from light flux controlling member 140 according to Embodiment 1 in the shape of first projected line 161.

(Configuration of Light Flux Controlling Member)

Figure 14A:
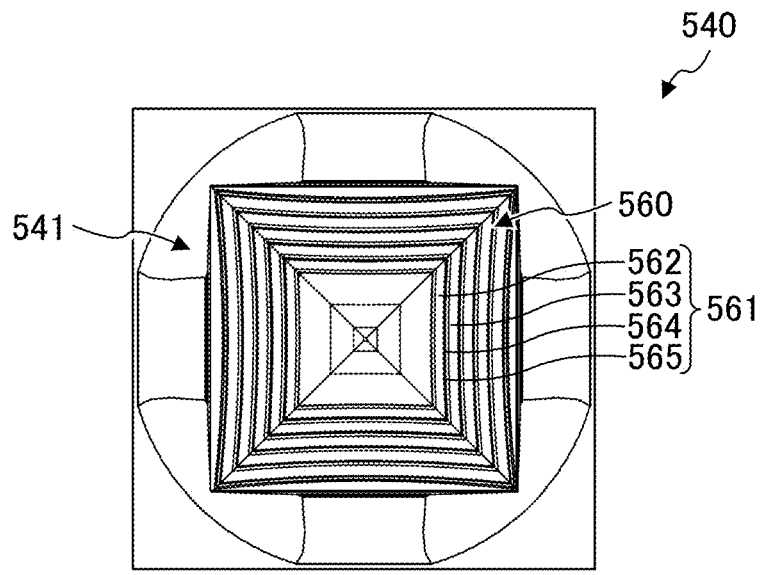
FIGS. 14A and 14B are bottom views of a light flux controlling member according to a modification of Embodiment 1.
Figure 14B:
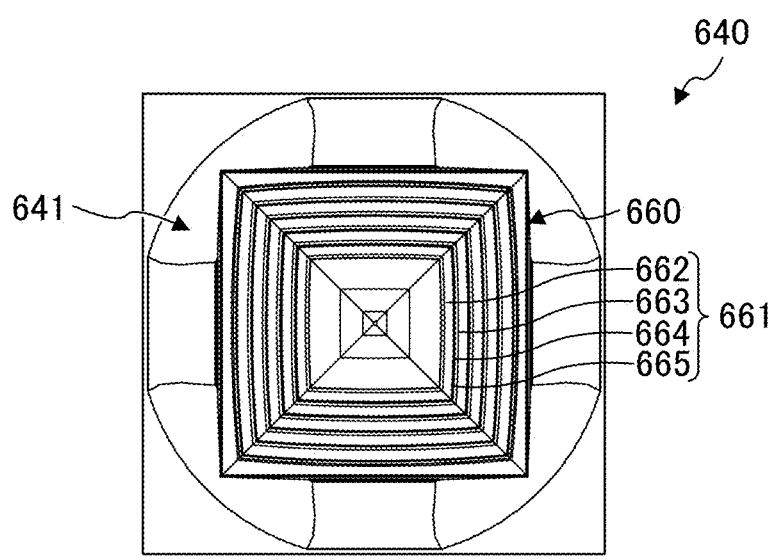

FIGS. 14A and 14B are bottom views of light flux controlling member 540 according to modifications of Embodiment 1 of the present invention. FIG. 14A is a bottom view of light flux controlling member 540 according to the modification 1 of Embodiment 1, and FIG. 14B is a bottom view of light flux controlling member 640 according to modification 2 of Embodiment 1.

As illustrated in FIG. 14A, incidence region 541 of light flux controlling member 540 according to the modification 1 of Embodiment 1 includes refraction section 150, fresnel lens section 560 and outermost lens section 170. Fresnel lens section 560 has a plurality of first projected lines 561 each including first incidence surface 562, first reflecting surface 563, first connection surface 564 and first ridgeline 565.

First incidence surface 562 is a curved surface. In a cross-section orthogonal to central axis CA (horizontal cross-section), the inner edge of first incidence surface 562 is a curve protruding toward central axis CA side. In addition, in a cross-section including central axis CA (vertical cross-section), first incidence surface 562 is tilted such that the distance from central axis CA increases toward the lower end of light flux controlling member 540 (reference surface). Although not illustrated in the drawings, in a cross-section including central axis CA (vertical cross-section), the inner edge of first reflecting surface 663 may be a curve. It is to be noted that, when the inner edge of first incidence surface 562 is a curve in a cross-section including central axis CA, the "angle of first incidence surface 562" is the angle of the tangent to first incidence surface 562 at a light incident point.

First reflecting surface 563 is a curved surface. In a cross-section orthogonal to central axis CA (horizontal cross-section), the outer edge of first reflecting surface 563 is a curve protruding toward central axis CA side. In addition, in a cross-section including central axis CA (vertical cross-section), the outer edge of first reflecting surface 563 is a curve. When the outer edge of first reflecting surface 563 is a curve in a cross-section including central axis CA, the "angle of first reflecting surface 563" is the angle of the tangent to first reflecting surface 563 at a light incident point.

First ridgeline 565 has an arc-like shape in plan view. The curvature radius of the arc (first ridgeline 565) is greater than the distance between the intersection of the diagonals of first virtual square S1 and the middle point of first ridgeline 565. It is possible to adjust the difference between the light distribution characteristics along the side of first virtual square S1 and the light distribution characteristics along diagonal L1 of first virtual square S1 by adjusting the curvature radius of the arc. For example, when the curvature radius of the arc is large (when first ridgeline 565 is a substantially straight line), the region irradiated with light emitted from light flux controlling member 540 is square. On the other hand, when the curvature radius of the arc is small (when the center of diagonals L1 of first virtual square S and the curvature center are close to each other), the region irradiated with the light emitted from light flux controlling member 540 has a rounded shape.

In addition, first ridgeline 565 is disposed to protrude toward central axis CA side in plan view (see FIG. 14A). That is, the curvature center of the arc is located at a position on the straight line passing through center O1 of first virtual square S1 (the intersection of diagonals L1) and the middle point of one side of first virtual square S1, and on the outer side of outermost first projected line 561. Further, as described above, the curvature radius of the arc is set to a value greater than the distance between the intersection of diagonals L1 of first virtual square S1 and a middle point of one side of first virtual square S1. In the present embodiment, the curvature centers of first ridgelines 565 coincide with each other. In this manner, the degree of light condensing can be adjusted by determining whether to protrude the shape of the arc to central axis.

In addition, as illustrated in FIG. 14B, incidence region 641 of light flux controlling member 640 according to modification 2 of Embodiment 1 includes refraction section 150, fresnel lens section 660 and outermost lens section 170. Fresnel lens section 660 has a plurality of first projected lines 661 each including first incidence surface 662, first reflecting surface 663, first connection surface 664 and first ridgeline 665.

First incidence surface 662 is a curved surface. In a cross-section orthogonal to central axis CA (horizontal cross-section), the inner edge of first incidence surface 662 is a curve protruding outward. In addition, in a cross-section including central axis CA (vertical cross-section), first incidence surface 662 is tilted such that the distance from central axis CA increases toward the lower end of light flux controlling member 640 (reference surface).

First reflecting surface 663 is also a curved surface. In a cross-section orthogonal to central axis CA (horizontal cross-section), the outer edge of first reflecting surface 663 is a curve protruding outward.

In addition, first ridgeline 665 is disposed to protrude outward in plan view. That is, the curvature center of the arc is located at a position on a straight line passing through center O1 of first virtual square S1 (the intersection of diagonals L1) and a middle point of one side of first virtual square S1, and the distance between the arc and the curvature center is greater than the distance between the center of first virtual square S1 and the curvature center.

(Effect)

As described above, the light-emitting device including the light flux controlling member according to the present embodiment is provided with corner portions 172 at four corners of outermost lens section 170, and thus can illuminate an illumination region with the light emitted via outermost lens section 170 in a square shape. That is, the use efficiency of light emitted from light emitting element 120 can be enhanced. In addition, since light-emitting device 100 can uniformly illuminate a square illumination region with light, quality can be enhanced.

Embodiment 2

Light flux controlling member 740, a light-emitting device and an illumination apparatus according to Embodiment 2 are respectively different from light flux controlling member 140, light-emitting device 100 and illumination apparatus 400 according to Embodiment 1 in the shape of outermost lens section 770 of light flux controlling member 740. Therefore, the same components as those of light flux controlling member 140, light-emitting device 100 and illumination apparatus 400 according to Embodiment 1 are denoted with the same reference numerals, and the descriptions thereof are omitted.

(Configuration of Light Flux Controlling Member)

Figure 15:
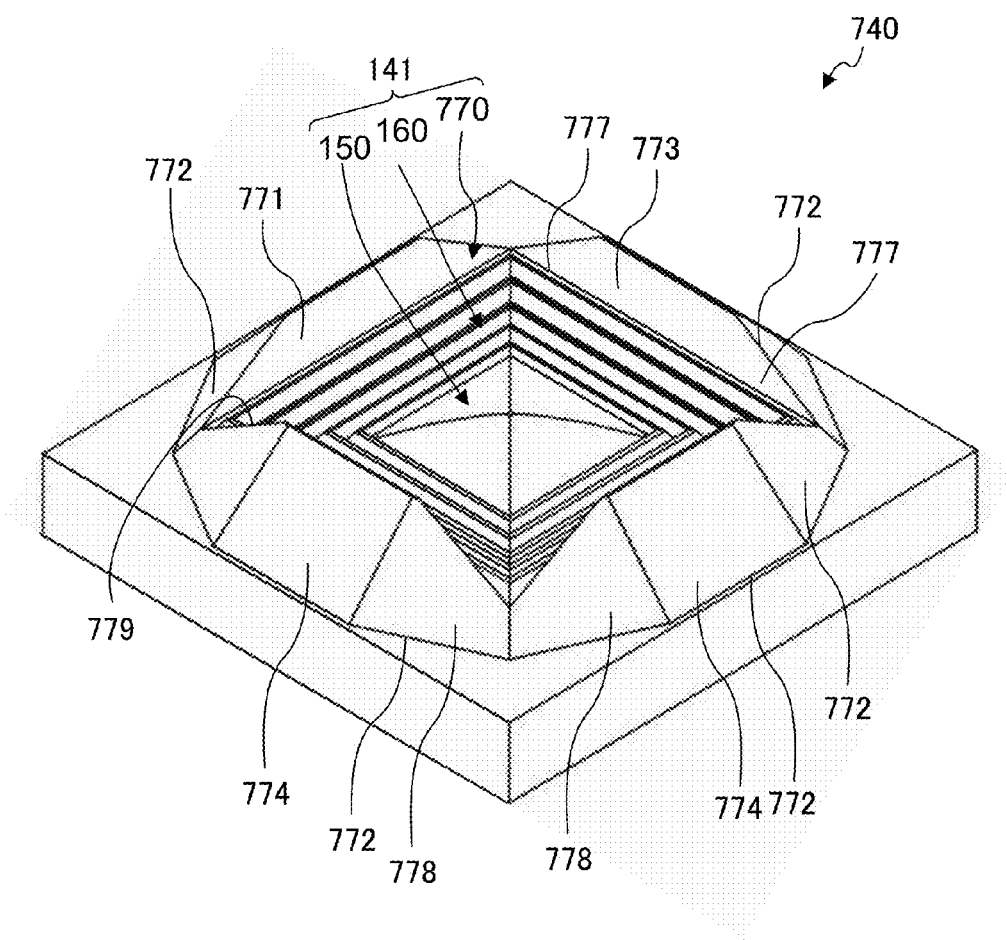
FIG. 15 is a perspective view of a light flux controlling member according to Embodiment 2.

FIG. 15 is a perspective view of light flux controlling member 740 according to Embodiment 2 of the present invention. As illustrated in FIG. 15, incidence region 141 of light flux controlling member 740 according to Embodiment 2 includes refraction section 150, fresnel lens section 160 and outermost lens section 770.

Outermost lens section 770 includes four second projected lines 771 and four corner portions 772. Each of four second projected lines 771 is formed in a triangular prism shape. The cross-sectional shape of second projected line 771 taken along the plane orthogonal to the side on which the second projected line 771 is disposed is a triangular shape. Each second projected line 771 includes second incidence surface 773, second reflecting surface 774 and second ridgeline 776. In second projected line 771, second incidence surface 773 is disposed on the inner side (central axis CA side), and second reflecting surface 774 is disposed on the outer side.

Second incidence surface 773 and second reflecting surface 774 are each a planar surface. Second incidence surface 773 is tilted such that the distance from central axis CA increases toward the lower end (reference surface) of light flux controlling member 740. The inner edge of second incidence surface 773 is a straight line in a cross-section orthogonal to central axis CA (horizontal cross-section), and also in a cross-section including central axis CA (perpendicular cross-section). Second reflecting surface 774 is tilted such that the distance to central axis CA decreases toward the lower end (reference surface) of light flux controlling member 740. The outer edge of second reflecting surface 774 is a straight line in a cross-section orthogonal to central axis CA, and also in a cross-section including central axis CA.

Each of four corner portions 772 is a part of a pyramid. Corner portion 772 includes third incidence surface 777, third reflecting surface 778 and third ridgeline 779.

Third incidence surface 777 and third reflecting surface 778 are each composed of two planar surfaces. The two surfaces of third incidence surface 777 are each tilted such that the distance from central axis CA increases toward the lower end of light flux controlling member 740 (reference surface). In a cross-section orthogonal to central axis CA (horizontal cross-section), and also in a cross-section including central axis CA (perpendicular cross-section), the inner edges of two surfaces of third incidence surface 777 are each a straight line. The two surfaces of third reflecting surface 778 are each tilted such that the distance to central axis CA decreases toward the lower end of light flux controlling member 740 (reference surface). In a cross-section orthogonal to central axis CA, and also in a cross-section including central axis CA, the outer edges of the two surfaces of third reflecting surface 778 are each a straight line.

Third ridgeline 779 is a boundary line between third incidence surface 777 and third reflecting surface 778. This boundary may be chamfered to form a connection surface (third connection surface). In that case, third ridgeline 779 is a boundary line between third incidence surface 777 and the third connection surface. Third ridgeline 779 is a straight line whose distance to emission region 142 decreases toward second diagonal L2 of second virtual square S2 from the second projected line 771 side. Thus, a recessed portion is formed at a position where corner portion 772 and second diagonal L2 of second virtual square S2 intersect with each other. Of the light emitted from light emitting element 120 toward corner portion 772, the light that passes through the recessed portion travels toward the region to be illuminated without being controlled by corner portion 772. The amount of such uncontrolled light is small, and therefore a desired square-shaped illuminance distribution of illustrated in FIG. 12 can be obtained as in Embodiment 1. Consequently, even when a burr-like wall part which is parallel to central axis CA is formed at the recessed portion from third ridgeline 779, an effect similar to that of Embodiment 1 is obtained when the burr-like wall part has no light flux controlling function (a second modification of Embodiment 3, see FIGS. 22 to 24).

It is to be noted that, also in the present embodiment, first ridgeline 165 of first projected line 161 may be a curve protruding toward central axis CA side, or a curve protruding outward.

(Effect)

Light flux controlling member 740, the light-emitting device and the illumination apparatus according to Embodiment 2 provide an effect similar to that of the light flux controlling member, the light-emitting device and the illumination apparatus according to Embodiment 1.

Embodiment 3

Light flux controlling member 840, a light-emitting device and an illumination apparatus according to Embodiment 3 are respectively different from light flux controlling member 140, light-emitting device 100 and illumination apparatus 400 according to Embodiment 1 in the shape of outermost lens section 870 of light flux controlling member 840. Therefore, the same components as those of light flux controlling member 140, light-emitting device 100 and illumination apparatus 400 according to Embodiment 1 are denoted with the same reference numerals, and the descriptions thereof are omitted.

(Configuration of Light Flux Controlling Member)

Figure 16:
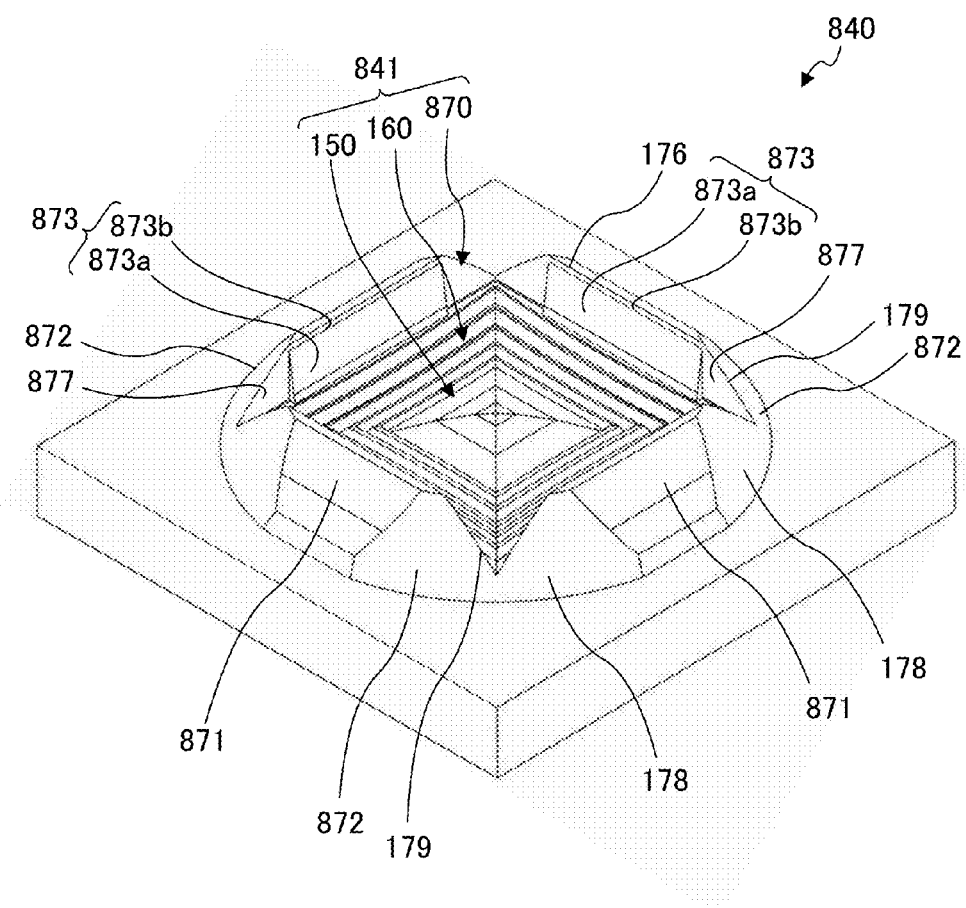
FIG. 16 is a perspective view of a light flux controlling member according to Embodiment 3.
Figure 17A:
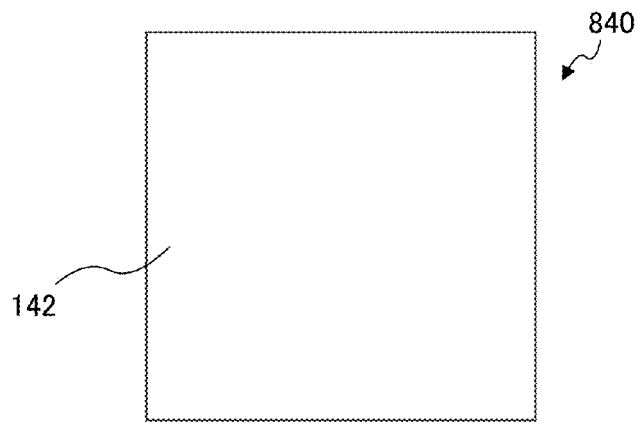
FIGS. 17A to 17C illustrate a configuration of the light flux controlling member according to Embodiment 3.
Figure 17B:
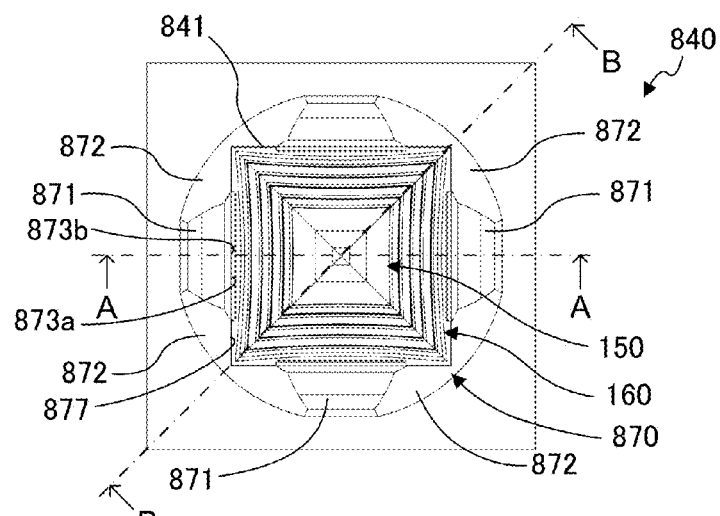
Figure 17C:
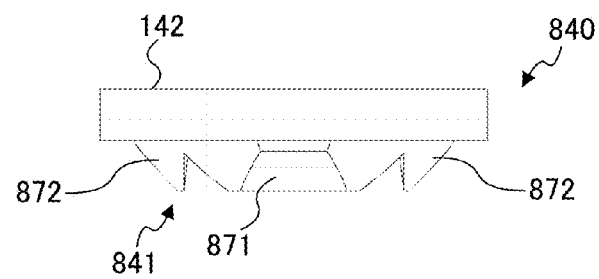
Figure 18A:
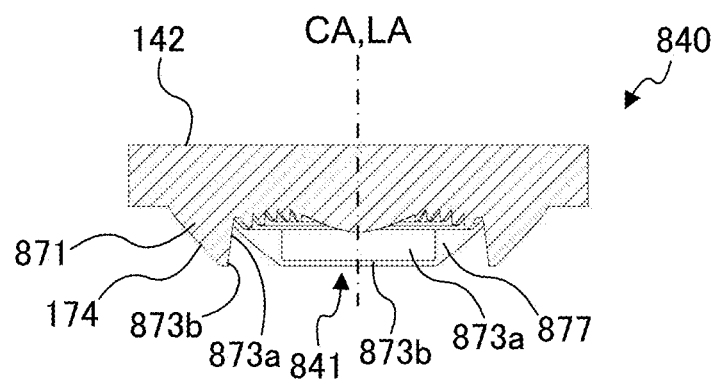
FIGS. 18A and 18B are sectional views of the light flux controlling member according to Embodiment 3.
Figure 18B:
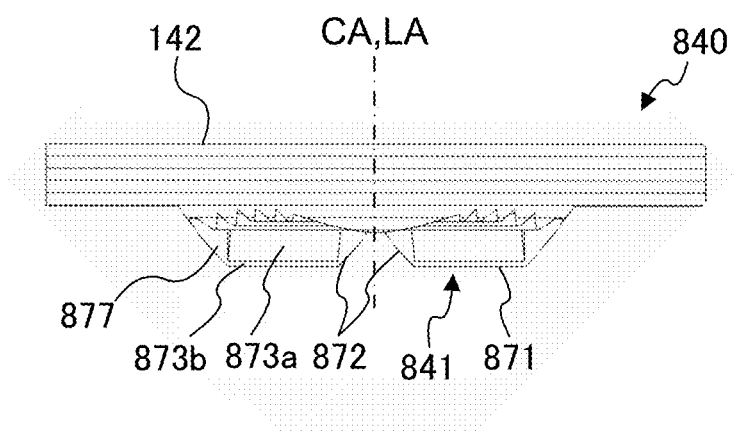

FIG. 16 to FIG. 18 illustrate a configuration of light flux controlling member 840 according to Embodiment 3. FIG. 16 is a perspective view of light flux controlling member 840 according to Embodiment 3. FIGS. 17A to 17C are a plan view, a bottom view, and a side view of light flux controlling member 840, respectively. FIG. 18A is a sectional view taken along line A-A of FIG. 17B, and FIG. 18B is a sectional view taken along line B-B of FIG. 17B. As illustrated in FIG. 16 to FIG. 18, incidence region 841 of light flux controlling member 840 according to Embodiment 3 includes refraction section 150, fresnel lens section 160 and outermost lens section 870.

Outermost lens section 870 includes four second projected lines 871 and four corner portions 872. Each of four second projected lines 871 are formed in a substantially triangular prism shape. Second projected line 871 has a substantially triangular shape in a cross-section taken along the plane orthogonal to the side on which the second projected line 871 is disposed. Each second projected line 871 includes second incidence surface 873, second reflecting surface 174 and second ridgeline 176. In second projected line 871, second incidence surface 873 is disposed on the inner side (central axis CA side), and second reflecting surface 174 is disposed on the outer side.

Second incidence surface 873 includes tilted surface 873a disposed on the emission region 142 side, and parallel surface 873b disposed on the lower end side of light flux controlling member 840 (reference surface). Tilted surface 873a is tilted such that the distance from central axis CA increases toward the lower end (reference surface) of light flux controlling member 840. On the other hand, parallel surface 873b is a surface parallel to central axis CA (optical axis LA of light emitting element 120). As described in Embodiment 1, incidence region 841 of light flux controlling member 840 according to Embodiment 3 is two-fold rotational symmetry or four-fold rotational symmetry around the center of first virtual square S1 and second virtual square S2 as the rotational axis. The rotational axis coincides with central axis CA of light flux controlling member 840 and optical axis LA of light emitting element 120. Accordingly, parallel surface 873b is also parallel to the rotational axis.

Each of four corner portions 872 is a part of a substantially conical member. Corner portion 872 includes third incidence surface 877, third reflecting surface 178 and third ridgeline 179. In corner portion 872, third incidence surface 877 is disposed on the inner side (central axis CA side), and third reflecting surface 178 is disposed in the outer side.

Each third incidence surface 877 is composed of two planar surfaces. The two surfaces of third incidence surface 877 are planar surfaces parallel to central axis CA (optical axis LA of light emitting element 120) and the above-described rotational axis. Third incidence surface 877 is continuous from parallel surface 873b of adjacent second incidence surface 873 and forms one planar surface. Consequently, the surface parallel to the above-described rotational axis (parallel surface 873b) included in the second incidence surface 873 and the surface parallel to the above-described rotational axis included in third incidence surface 877 are continuously disposed so as to enclose fresnel lens section 160.

(Effect)

Light flux controlling member 840, the light-emitting device and the illumination apparatus according to Embodiment 3 provide an effect similar to that of the light flux controlling member, the light-emitting device and the illumination apparatus according to Embodiment 1. In addition, in light flux controlling member 840 according to Embodiment 3, the planar surfaces parallel to central axis CA (optical axis LA of light emitting element 120 and the above-described rotational axis) are disposed to enclose fresnel lens section 160. With this configuration, light flux controlling member 840 according to Embodiment 3 is suitable for manufacturing which uses a piece for shaping refraction section 150 and fresnel lens section 160, and another piece for shaping outermost lens section 870.

(First Modification)

Figure 19:
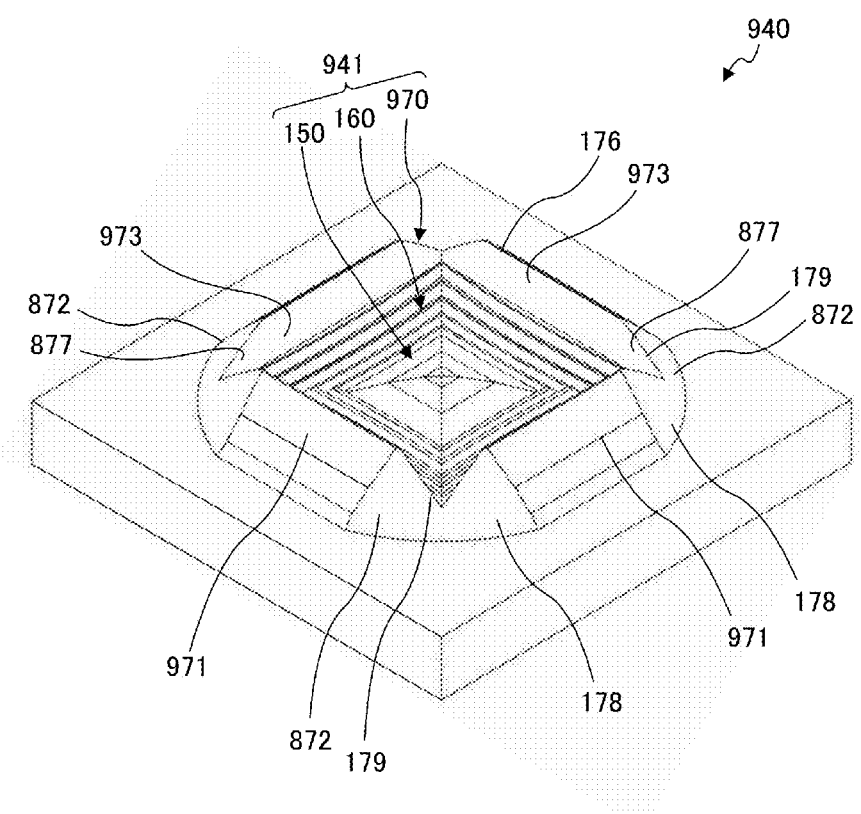
FIG. 19 is a perspective view of a light flux controlling member according to a first modification of Embodiment 3.
Figure 20A:
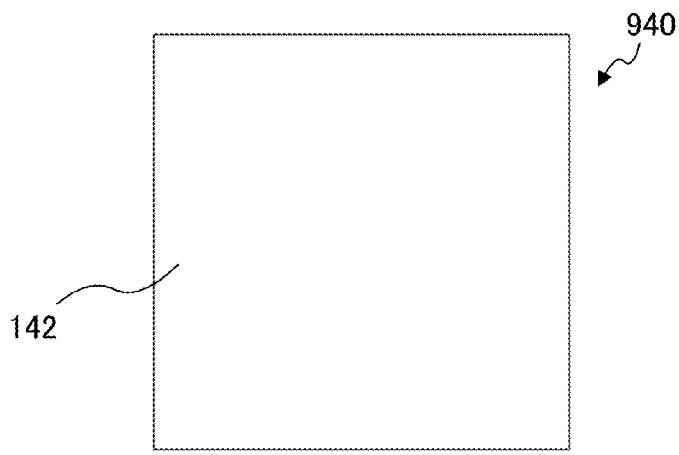
FIGS. 20A to 20C illustrate a configuration of the light flux controlling member according to the first modification of Embodiment 3.
Figure 20B:
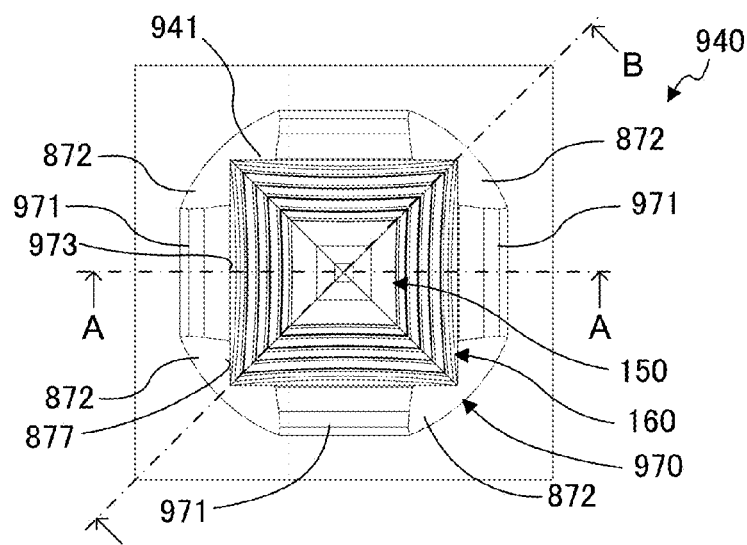
Figure 20C:
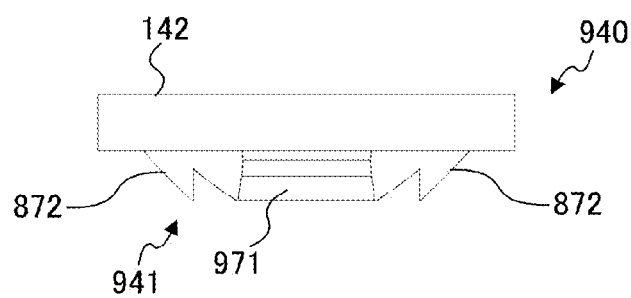
Figure 21A:
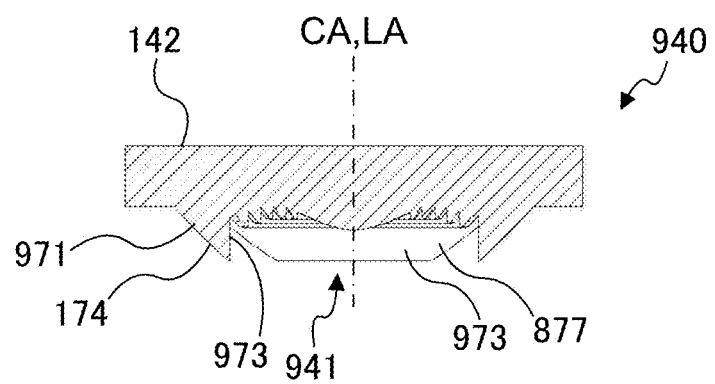
FIGS. 21A and 21B are sectional views of the light flux controlling member according to the first modification of Embodiment 3.
Figure 21B:
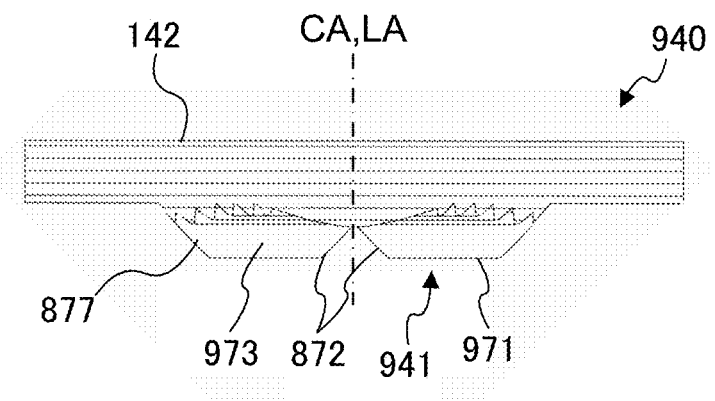

FIG. 19 to FIG. 21 illustrate a configuration of light flux controlling member 940 according to the first modification of Embodiment 3. FIG. 19 is a perspective view of light flux controlling member 940 according to the first modification of Embodiment 3. FIGS. 20A to 20C are a plan view, a bottom view, and a side view of light flux controlling member 940, respectively. FIG. 21A is a sectional view taken along line A-A of FIG. 20B, and FIG. 21B is a sectional view taken along line B-B of FIG. 20B. As illustrated in FIG. 19 to FIG. 21, incidence region 941 of light flux controlling member 940 includes refraction section 150, fresnel lens section 160 and outermost lens section 970.

Outermost lens section 970 includes four second projected lines 971, and four corner portions 872. Each of four second projected lines 971 is formed in a substantially triangular prism shape. Second projected line 971 has a substantially triangular shape in cross-section taken along the plane orthogonal to the side on which the second projected line 971 is disposed. Each second projected line 971 includes second incidence surface 973, second reflecting surface 174 and second ridgeline 176. In second projected line 971, second incidence surface 973 is disposed on the inner side (central axis CA side), and second reflecting surface 174 is disposed on the outer side. Second incidence surface 973 is a planar surface parallel to central axis CA (optical axis LA of light emitting element 120) and the above-described rotational axis.

Each of four corner portions 872 is a part of a substantially conical member. Corner portion 872 includes third incidence surface 877, third reflecting surface 178 and third ridgeline 179. In corner portion 872, third incidence surface 877 is disposed on the inner side (central axis CA side), and third reflecting surface 178 is disposed on the outer side.

Third incidence surface 877 is composed of two planar surfaces. The two surfaces of third incidence surface 877 are planar surfaces parallel to central axis CA (optical axis LA of light emitting element 120) and the above-described rotational axis. Third incidence surface 877 is continuous from adjacent second incidence surface 973 and forms one planar surface. As a result, the above-described surfaces (second incidence surface 973 and third incidence surface 877) parallel to the rotational axis are continuously disposed to enclose fresnel lens section 160.

(Effect)

Light flux controlling member 940 according to the first modification of Embodiment 3 has an effect similar to that of light flux controlling member 840 according to Embodiment 3.

(Second Modification)

Figure 22:
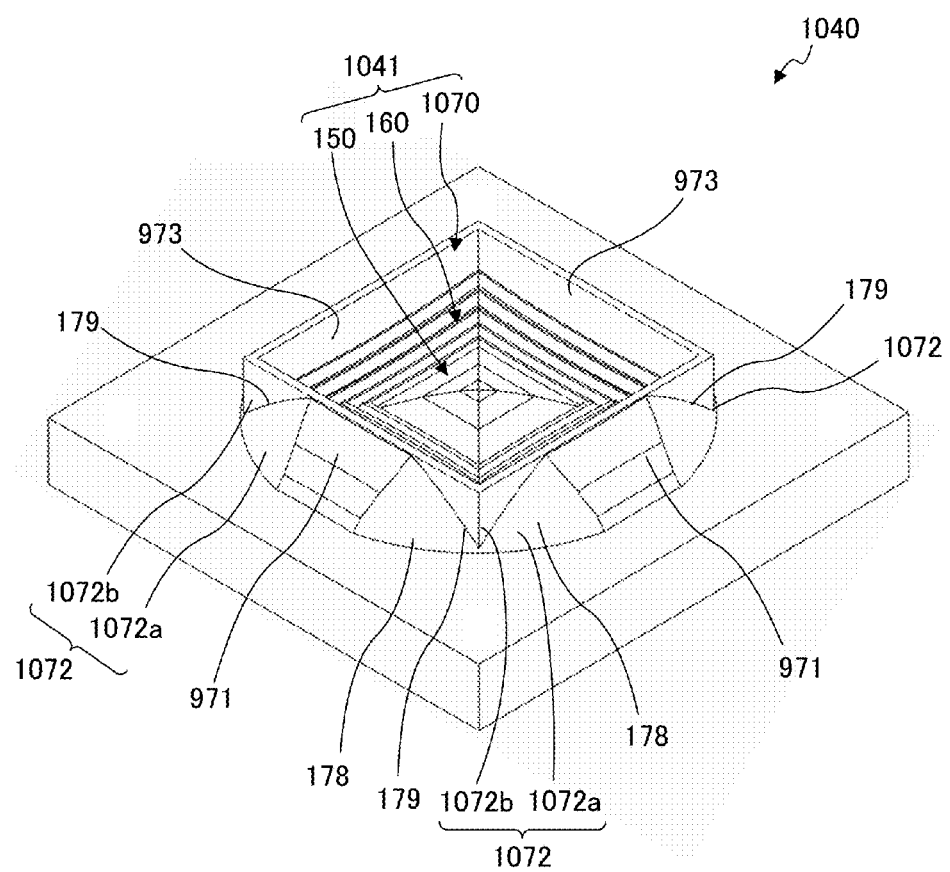
FIG. 22 is a perspective view of a light flux controlling member according to a second modification of Embodiment 3.
Figure 23A:
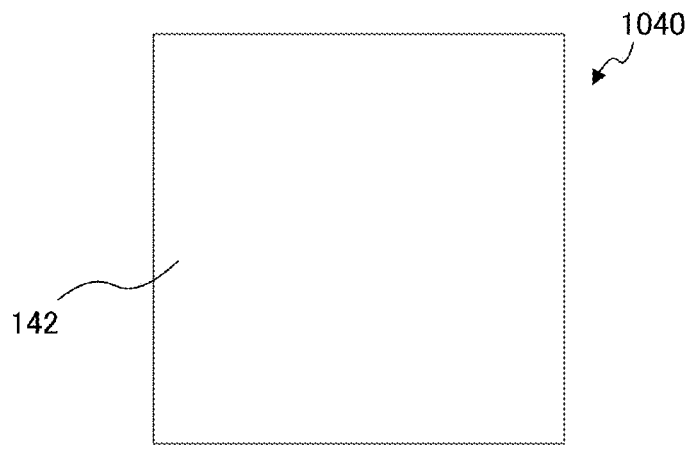
FIGS. 23A to 23C illustrate a configuration of the light flux controlling member according to the second modification of Embodiment 3.
Figure 23B:
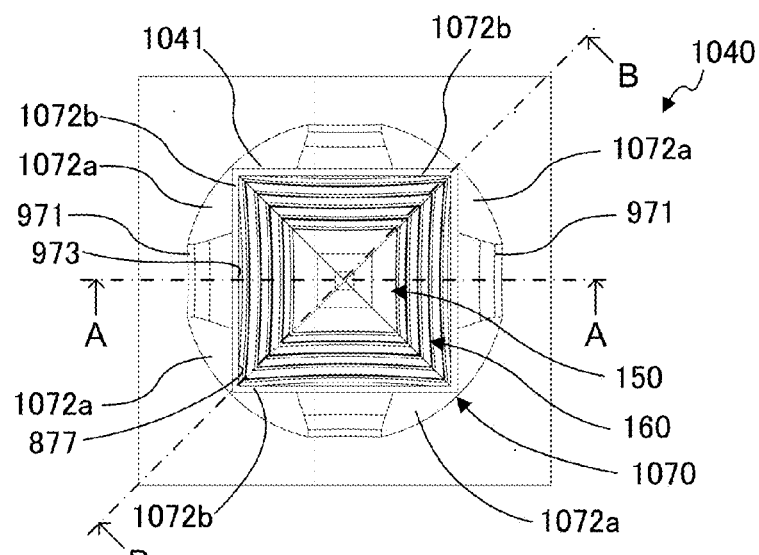
Figure 23C:
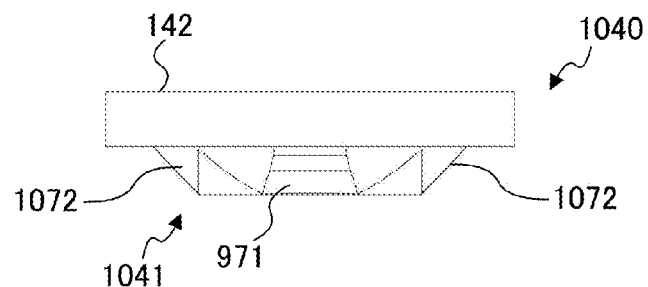
Figure 24A:
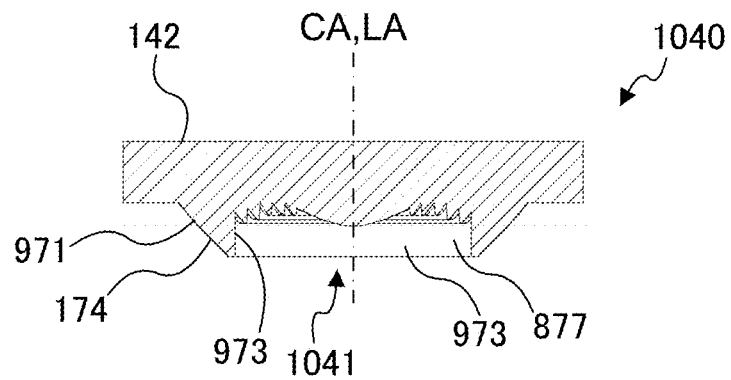
FIGS. 24A and 24B are sectional views of the light flux controlling member according to the second modification of Embodiment 3.
Figure 24B:
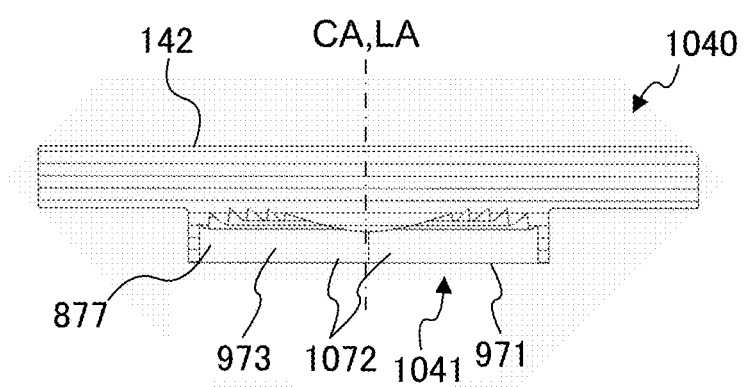

FIG. 22 to FIG. 24 illustrate a configuration of light flux controlling member 1040 according to the second modification of Embodiment 3. FIG. 22 is a perspective view of light flux controlling member 1040 according to the second modification of Embodiment 3. FIGS. 23A to 23C are a plan view, a bottom view, and a side view of light flux controlling member 1040, respectively. FIG. 24A is a sectional view taken along line A-A of FIG. 23B, and FIG. 24B is a sectional view taken along line B-B of FIG. 23B. As illustrated in FIG. 22 to FIG. 24, incidence region 1041 of light flux controlling member 1040 includes refraction section 150, fresnel lens section 160 and outermost lens section 1070.

Outermost lens section 1070 includes four second projected lines 971, and four corner portions 1072. Each of four second projected lines 971 is formed in a substantially triangular prism shape. Second projected line 971 has a substantially triangular shape in cross-section taken along the plane orthogonal to the side on which the second projected line 971 is disposed. Each second projected line 971 includes second incidence surface 973, second reflecting surface 174 and second ridgeline 176. In second projected line 971, second incidence surface 973 is disposed on the inner side (central axis CA side), and second reflecting surface 174 is disposed on the outer side. Second incidence surface 973 is a planar surface parallel to central axis CA (optical axis LA of light emitting element 120) and the above-described rotational axis.

In four corner portions 1072, burr-like wall part 1072*b* is provided to corner portion main bodies 1072*a* having the same configuration as corner portions 872 of light flux controlling member 940 according to the first modification. At the recessed portion of corner portion main body 1072*a*, wall part 1072*b* is extended parallel to central axis CA and the above-described rotational axis from third ridgeline 779. The internal surface (third incidence surface 877) of wall part main body 1072*a* and the internal surface of wall part 1072*b* are each composed of two planar surfaces. These planar surfaces are continuous from adjacent second incidence surface 973 and form one planar surface. As a result, the surfaces (second incidence surface 973, third incidence surface 877 and the internal surface of wall part 1072*b*) parallel to the above-described rotational axis are continuously disposed to enclose fresnel lens section 160.

While wall part 1072*b* is provided between third incidence surface 877 and third reflecting surface 178, wall part 1072*b* has no practical light flux controlling function in light flux controlling member 1040 according to the second modification. Therefore, in the second modification, the boundary line between wall part 1072*b* and third reflecting surface 178, which has substantially the same track as that of third ridgeline 179 of light flux controlling member 940 according to the first modification, is considered to be third ridgeline 179.

(Effect)

Light flux controlling member 1040 according to the second modification of Embodiment 3 has an effect similar to that of light flux controlling member 840 according to Embodiment 3.

Embodiment 4

Light flux controlling member 1140, a light-emitting device and an illumination apparatus according to Embodiment 4 are respectively different from light flux controlling member 540, the light-emitting device and the illumination apparatus according to Embodiment 1 in the shape of outermost lens section 1170 of light flux controlling member 1140. Therefore, the same components as those of light flux controlling member 540, the light-emitting device and the illumination apparatus according to Embodiment 1 are denoted with the same reference numerals, and the descriptions thereof are omitted.

(Configuration of Light Flux Controlling Member)

Figure 25:
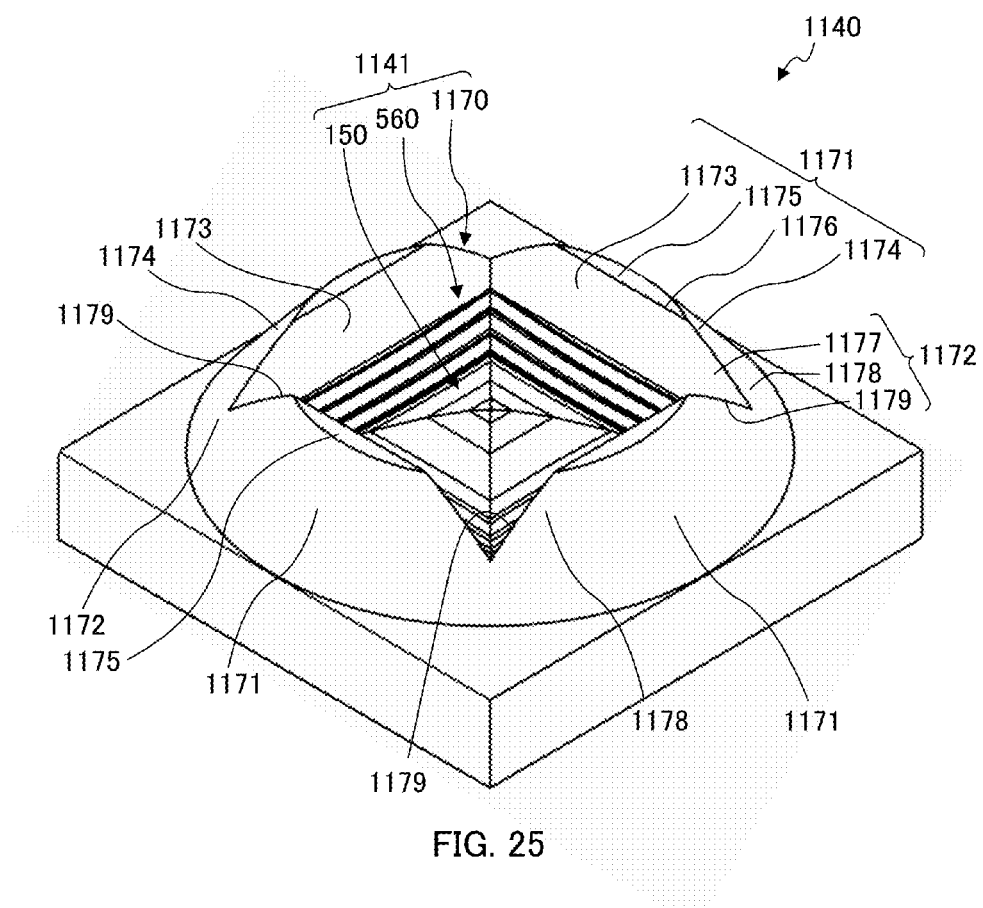
FIG. 25 is a perspective view of a light flux controlling member according to Embodiment 4.
Figure 26A:
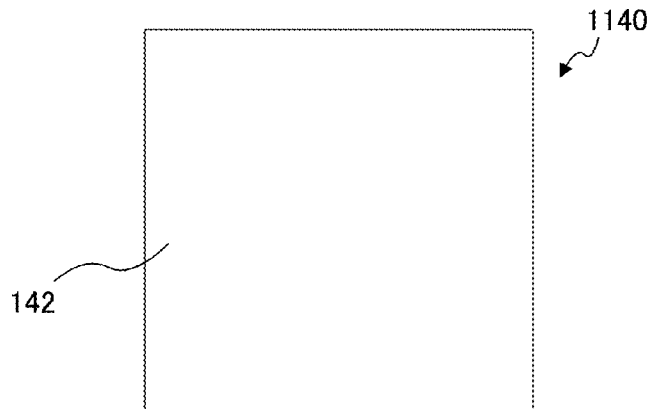
FIGS. 26A to 26C illustrate a configuration of the light flux controlling member according to Embodiment 4.
Figure 26B:
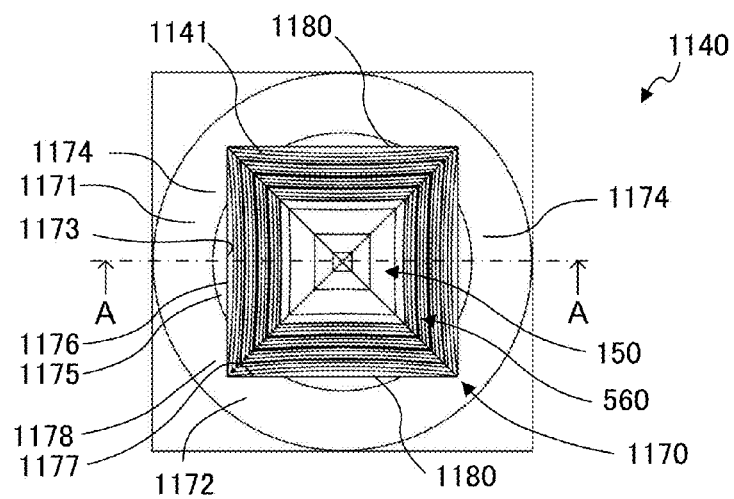
Figure 26C:
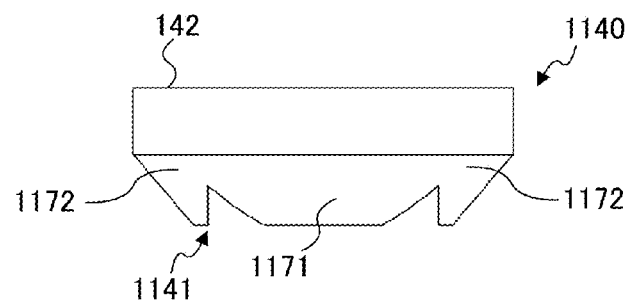
Figure 27A:
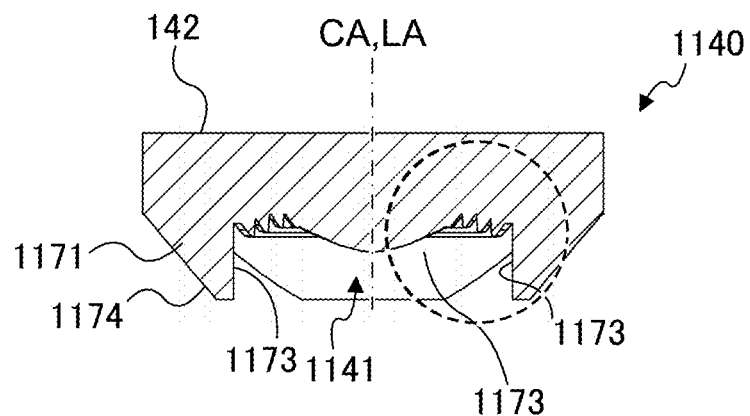
FIGS. 27A and 27B are sectional views of the light flux controlling member according to Embodiment 4.
Figure 27B:
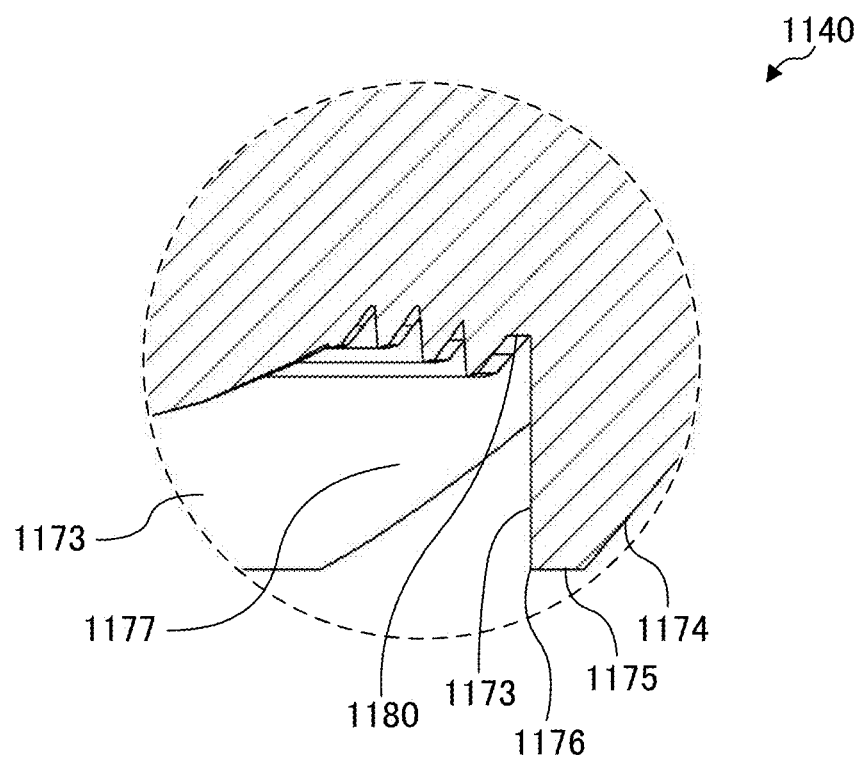

FIG. 25 to FIG. 27 illustrate a configuration of light flux controlling member 1140 according to Embodiment 4. FIG. 25 is a perspective view of light flux controlling member 1140 according to Embodiment 4. FIGS. 26A to 26C are a plan view, a bottom view, and a side view of light flux controlling member 1140, respectively. FIG. 27A is a sectional view taken along line A-A of FIG. 26B, and FIG. 27B is a partially enlarged sectional view of the region indicated with the broken line in FIG. 27A.

As illustrated in FIG. 25 to FIG. 27, light flux controlling member 1140 includes incidence region 1141 and emission region 142. Incidence region 1141 includes refraction section 150, fresnel lens section 560 and outermost lens section 1170. Outermost lens section 1170 includes four second projected lines 1171, and four corner portions 1172.

Each of four second projected lines 1171 is a part of a substantially conical member having a circular bottom surface whose vertex is located on the center O2 side of second virtual square S2. Here the "substantially conical member having a circular bottom surface" means a stereoscopic shape which is formed by connecting the vertex and the outer peripheral edge of the circular bottom surface with a straight line or a curved line. Examples of the substantially conical member having a circular bottom surface include a cone whose line connecting the vertex and the circumferential points of the bottom surface is a straight line, a substantially conical member whose generatrix protrudes outward, a substantially conical member whose generatrix protrudes inward and the like. In the present embodiment, the substantially conical member (cone) is a substantially conical member whose generatrix protrudes outward.

Each second projected line 1171 includes second incidence surface 1173, second reflecting surface 1174, second connection surface 1175 and second ridgeline 1176. In second projected line 1171, second incidence surface 1173 is disposed on the inner side (central axis CA side), and second reflecting surface 1174 is disposed on the outer side.

Second incidence surface 1173 is a planar surface parallel to central axis CA (optical axis LA of light emitting element 120) and the center (rotational axis) of second virtual square S2. Second reflecting surface 1174 is a curved surface. In a cross-section orthogonal to central axis CA (horizontal cross-section), the outer edge of second reflecting surface 1174 is a curved line protruding outward. In addition, in a cross-section including central axis CA (perpendicular cross-section), the outer edge of second reflecting surface 1174 is a curved line protruding outward. Second reflecting surface 1174 corresponds to a part of a side surface of a substantially conical member, and connects two adjacent third reflecting surfaces 1178 so as to join adjacent two third reflecting surfaces 1178.

Second connection surface 1175 joins second incidence surface 1173 and second reflecting surface 1174. Second connection surface 1175 may be a planar surface or a curved surface. In the present embodiment, second connection surface 1175 is a planar surface. In addition, it is also possible to directly join second incidence surface 1173 and second reflecting surface 1174 without forming second connection surface 1175.

Second ridgeline 1176 is a boundary line between second incidence surface 1173 and second connection surface 1175. It is to be noted that, when second connection surface 1175 is not formed, second ridgeline 1176 is a boundary line between second incidence surface 1173 and second reflecting surface 1174. When second connection surface 1175 is provided between second incidence surface 1173 and second reflecting surface 1174, manufacturing performance can be enhanced by eliminating an acute angle portion.

Each of four corner portions 1172 is a part of a substantially conical member having a circular bottom surface whose vertex is located on center O2 side of second virtual square S2. Corner portion 1172 includes third incidence surface 1177, third reflecting surface 1178 and third ridgeline 1179. In the present embodiment, the substantially conical member (cone) is a substantially conical member whose generatrix protrudes outward. The shape of the substantially conical member in second projected line 1171, and the shape of the substantially conical member in corner portion 1172 are identical to each other.

Third incidence surface 1177 is composed of two planar surfaces parallel to central axis CA. Third reflecting surface 1178 is a curved surface. In a cross-section orthogonal to central axis CA (horizontal cross-section), the outer edge of third reflecting surface 1178 is a curved line protruding outward. In addition, in a cross-section including central axis CA (perpendicular cross-section), the outer edge of third reflecting surface 1178 is a curved line protruding outward. Third reflecting surface 1178 corresponds to a part of a side surface of a substantially conical member, and connects adjacent two second reflecting surface 1174 so as to join adjacent two second reflecting surface 1174. As described above, the shape of the substantially conical member in second projected line 1171 and the shape of the substantially conical shape in corner portion 1172 are identical to each other, and therefore, in a cross-section orthogonal to central axis CA (horizontal cross-section), second reflecting surface 1174 and third reflecting surface 1178 have a circular shape.

Third ridgeline 1179 is a boundary line between third incidence surface 1177 and third reflecting surface 1178. Third ridgeline 1179 is a curve which is formed such that the distance to emission region 142 gradually decreases toward second diagonal L2 of second virtual square S2 from second projected line 1171 side. In addition, in plan view of incidence region 1141, distance d3 between the outermost edge of third reflecting surface 1178 and third ridgeline 1179 gradually decreases toward second diagonal L2 of second virtual square S2. Thus, at a position where corner portion 1172 and second diagonal L2 of second virtual square S2 intersect with each other, a recessed portion is formed. It is to be noted that the boundary between third incidence surface 1177 and third reflecting surface 1178 may be chamfered to form a connection surface (third connection surface). In this case, third ridgeline 1179 is a boundary line between third incidence surface 1177 and the third connection surface.

A metal mold for producing light flux controlling member 1140 according to Embodiment 4 is separated into a metal mold piece (piece) for manufacturing refraction section 150 and fresnel lens section 560, and a metal mold piece for producing outermost lens section 1170. In this case, the boundary between the outer edge of fresnel lens section 560 and the internal edge of outermost lens section 1170 is the boundary between the metal mold pieces. In view of this, light flux controlling member 1140 according to the present embodiment includes a predetermined fourth connection surface 1180 between fresnel lens section 560 and outermost lens section 1170 at incidence region 1141.

As illustrated in FIG. 26B and FIG. 27B, fourth connection surface 1180 is disposed between fresnel lens section 560, and second incidence surface 1173 and third incidence surface 1177. Fourth connection surface 1180 is a planar surface. The width (the interval between the outer edge of fresnel lens section 560 and the internal edge of second projected line 1171) of fourth connection surface 1180 is not limited. The width of fourth connection surface 1180 is appropriately set in accordance with the size of light flux controlling member 1140. Preferably, the width of fourth connection surface 1180 is 10 to 100 μm.

(Effect)

Light flux controlling member 1140, the light-emitting device and the illumination apparatus according to Embodiment 4 provide an effect similar to that of the light flux controlling member, the light-emitting device and the illumination apparatus according to Embodiment 1. In addition, in light flux controlling member 1140 according to Embodiment 4, fourth connection surface 1180 is provided between fresnel lens section 560 and outermost lens section 1170. With this configuration, light flux controlling member 1140 according to Embodiment 4 is suitable for manufacturing which uses a piece for shaping refraction section 150 and fresnel lens section 560, and another piece for shaping outermost lens section 1170. Further, in a cross-section orthogonal to central axis CA (horizontal cross-section), second reflecting surface 1174 and third reflecting surface 1178 have a circular shape, and thus a piece for producing second projected line 1171 and corner portion 1172 can be easily manufactured.

This application is entitled to and claims the benefit of Japanese Patent Application No. 2013-178013 filed on Aug. 29, 2013, and Japanese Patent Application No. 2013-217232 filed on Oct. 18, 2013, the disclosure each of which including the specification, drawings and abstract is incorporated herein by reference in its entirety.

INDUSTRIAL APPLICABILITY

The light flux controlling member, the light-emitting device and the illumination apparatus according to the embodiments of the present invention can uniformly and efficiently illuminate a square illumination region. The light-emitting device according to the embodiments of the present invention is useful for a flash of a camera, for example. In addition, the illumination apparatus according to the embodiments of the present invention is useful for generally-used indoor illumination apparatuses, surface light source apparatuses in which a liquid crystal panel is an illuminated surface, and the like, for example.

REFERENCE SIGNS LIST

10 Fresnel lens
12 Groove
20 Cylindrical lens
100 Light-emitting device
120 Light emitting element
140, 140', 540, 640, 740, 840, 940, 1040, 1140 Light flux controlling member
141, 541, 641, 841, 941, 1041, 1141 Incidence region
142 Emission region
143 Flange
150 Refraction section
160, 560, 660 Fresnel lens section
161, 561, 661 First projected line
162, 562, 662 First incidence surface
163, 563, 663 First reflecting surface
164, 564, 664 First connection surface 165, 565, 665 First ridgeline
170, 170', 770, 870, 970, 1070, 1170 Outermost lens section
171, 771, 871, 971, 1171 Second projected line
172, 772, 872, 1072, 1172 Corner portion
173, 773, 873, 973, 1173 Second incidence surface
174, 774, 1174 Second reflecting surface
175, 1175 Second connection surface
176, 776, 1176 Second ridgeline
177, 777, 877, 1177 Third incidence surface
178, 778, 1178 Third reflecting surface
179, 779, 1179 Third ridgeline
400 Illumination apparatus
420 Cover
440 Substrate
873a Tilted surface
873b Parallel surface
1072a Corner portion main body
1072b Wall part
1180 Fourth connection surface
L1 First diagonal
L2 Second diagonal
S1 First virtual square
S2 Second virtual square
CA Central axis
LA Optical axis

The invention claimed is:

1. A light flux controlling member configured to control distribution of light emitted from a light emitting element, the light flux controlling member comprising:
   an incidence region on which the light emitted from the light emitting element is incident; and
   an emission region formed on a side opposite to the incidence region, and configured to emit light incident on the incidence region, wherein:
   the incidence region includes:
      a fresnel lens section including a plurality of first projected lines, each first projected line including a first incidence surface on which a part of the light emitted from the light emitting element is incident, a first reflecting surface paired with the first incidence surface and configured to reflect incident light toward the emission region, and a first ridgeline configured to join adjacent two diagonals of a first virtual square, and
      an outermost lens section including four second projected lines and corner portions, each second projected line including a second incidence surface on which another part of the light emitted from the light emitting element is incident, and a second reflecting surface paired with the second incidence surface and configured to reflect incident light toward the emission region, each second projected line being disposed on a side of a second virtual square disposed outside the first virtual square, each corner portion being disposed at one of four corners of the second virtual square and configured to connect adjacent two second projected lines of the four second projected lines to join the second projected lines;
   the first virtual square and the second virtual square are similar to each other, and are concentrically disposed such that sides thereof are parallel to each other;
   the incidence region is two-fold rotational symmetry or four-fold rotational symmetry around a center of the first virtual square and a center of the second virtual square as a rotational axis;
   the corner portion is a part of a substantially conical member whose vertex is located on a center side of the second virtual square, the corner portion including a third reflecting surface and a third incidence surface which correspond to side surfaces of the substantially conical member, the third reflecting surface being configured to connect the two adjacent second reflecting surfaces to join the second reflecting surfaces, the third incidence surface being paired with the third reflecting surface and being a surface on which still another part of the light emitted from the light emitting element section is incident;
   a third ridgeline formed at a connecting part between the third incidence surface and the third reflecting surface has a height which gradually decreases toward a diagonal of the second virtual square;
   an interval between an outermost edge of the third reflecting surface and the third ridgeline gradually decreases toward the diagonal of the second virtual square in plan view of the incidence region; and
   an end-to-end distance of a second ridgeline of the second projected line is smaller than an end-to-end distance of the first ridgeline of the first projected line located at an outermost position.

2. The light flux controlling member according to claim 1, wherein the corner portion is a part of a cone or a part of a pyramid.

3. The light flux controlling member according to claim 1, wherein the first ridgeline joining adjacent two diagonals of the first virtual square is a straight line or a curved line.

4. The light flux controlling member according to claim 1, wherein:
   each of the second incidence surface and the third incidence surface includes a planar surface parallel to the rotational axis; and
   the planar surface included in the second incidence surface and the planar surface included in the third incidence surface are continuously disposed to enclose the fresnel lens section.

5. A light-emitting device comprising:
   a light emitting element; and
   the light flux controlling member according to claim 1, wherein:
   the light flux controlling member is disposed such that an optical axis of the light emitting element passes through a center of the second virtual square; and
   the second ridgeline has a length greater than a maximum size of the light emitting element in an extending direction of the second projected line.

6. An illumination apparatus comprising:
   the light-emitting device according to claim 5; and
   a cover configured to allow the light emitted from the light-emitting device to pass therethrough while diffusing the light.

* * * * *